(12) United States Patent
Nakamura

(10) Patent No.: US 6,538,280 B2
(45) Date of Patent: *Mar. 25, 2003

(54) TRENCHED SEMICONDUCTOR DEVICE AND METHOD OF FABRICATING THE SAME

(75) Inventor: Katsumi Nakamura, Chiyoda-ku (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/007,228

(22) Filed: Jan. 14, 1998

(65) Prior Publication Data

US 2001/0042885 A1 Nov. 22, 2001

(30) Foreign Application Priority Data

Jul. 11, 1997 (JP) .............................................. 9-186603

(51) Int. Cl.⁷ .............................................. H01L 29/76
(52) U.S. Cl. ....................................... 257/333; 257/411
(58) Field of Search ................................. 257/301, 330, 257/333, 77, 411, 329, 334, 754

(56) References Cited

U.S. PATENT DOCUMENTS

| T938,004 I4 | * | 9/1975 | Lehman et al. ............. 257/411 |
| 4,250,519 A | * | 2/1981 | Mogi et al. .................. 257/333 |
| 4,755,865 A | * | 7/1988 | Wilson et al. ............... 257/754 |
| 4,774,197 A | * | 9/1988 | Haddad et al. ............. 438/585 |
| 4,918,503 A | | 4/1990 | Okuyama .................. 357/23.6 |
| 5,321,289 A | * | 6/1994 | Baba et al. ................. 257/334 |
| 5,541,425 A | | 7/1996 | Nishihara .................... 257/139 |
| 5,714,781 A | * | 2/1998 | Yamamoto et al. ......... 257/333 |
| 5,973,373 A | * | 10/1999 | Krautschneider et al. ... 257/330 |
| 5,986,304 A | * | 11/1999 | Hshieh et al. ............... 257/329 |
| 6,020,600 A | * | 2/2000 | Miyajima et al. ............. 257/77 |
| 6,111,290 A | * | 8/2000 | Uenishi et al. ............. 257/330 |
| 6,150,693 A | * | 11/2000 | Wollesen .................... 257/330 |

FOREIGN PATENT DOCUMENTS

| JP | 63-302524 | 12/1988 |
| JP | 64-27252 | 1/1989 |
| JP | 1-293564 | 11/1989 |
| JP | 1-295462 | 11/1989 |
| JP | 2-23646 | 1/1990 |
| JP | 7-130679 | 5/1995 |
| JP | 7-249769 | 9/1995 |

OTHER PUBLICATIONS

Sakina, Yasuharu, et al, "Two–Dimensional Analysis of Thermal Oxidation of Silicon," *Japanese Journal of Applied Physics*, vol. 22, No. 8, Aug. 1983, pp. L514–L516.

* cited by examiner

*Primary Examiner*—Mark V. Prenty
(74) *Attorney, Agent, or Firm*—McDermott, Will & Emery

(57) ABSTRACT

In a trenched MOS gate power device having a trenched MOS gate structure, a gate insulating film is formed on the walls of trenches to extend onto a major surface of a semiconductor substrate, and gates are formed so as to fill up the trenches and to extend onto the gate insulating film on the major surface of the semiconductor substrate. The gate insulating film is formed so that the thickness of a portion thereof formed on the major surface of the semiconductor substrate is greater than that of a portion thereof formed on the walls of the trenches to narrow portions of the gates corresponding to the tops of the trenches. Thus, the characteristics of a gate insulating film formed on the walls of trenches are improved.

7 Claims, 20 Drawing Sheets

FIG.14(a)
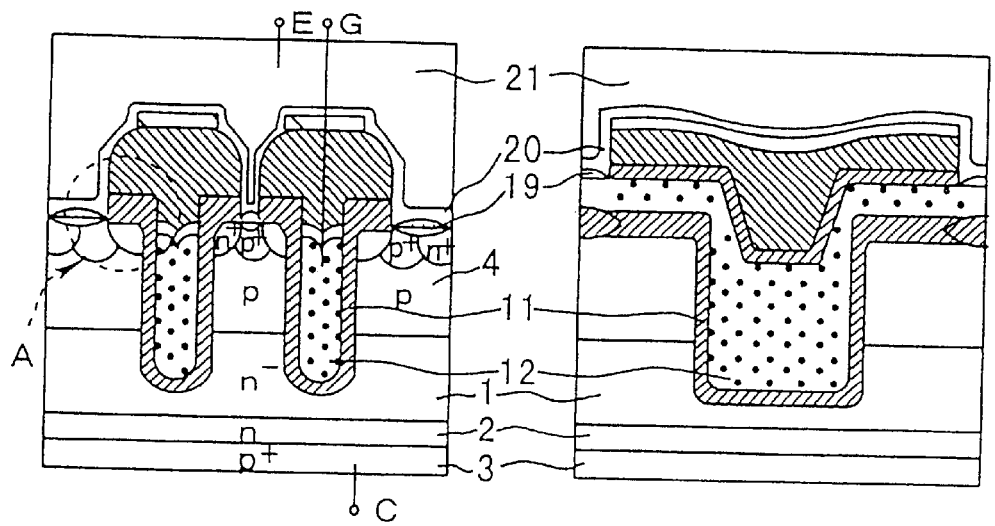
FIG.14(b)
FIG.14(c)
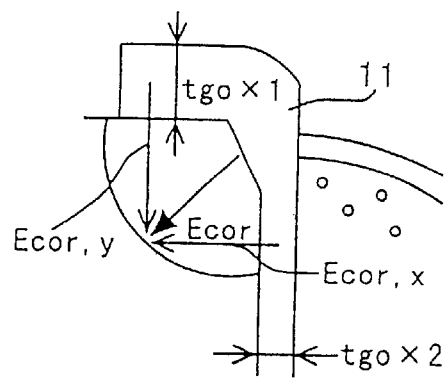
FIG.14(d)
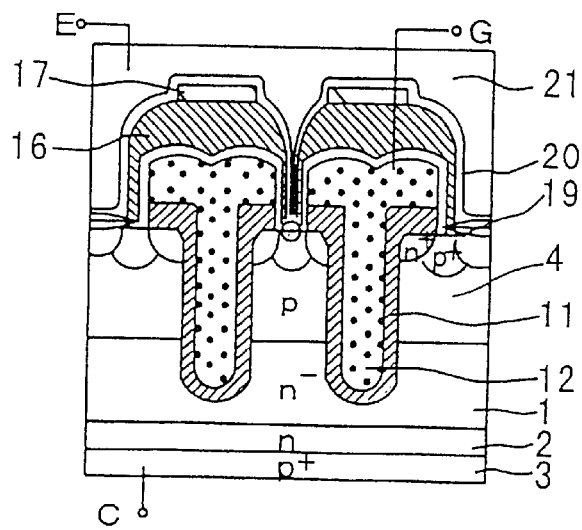

FIG.16(a)
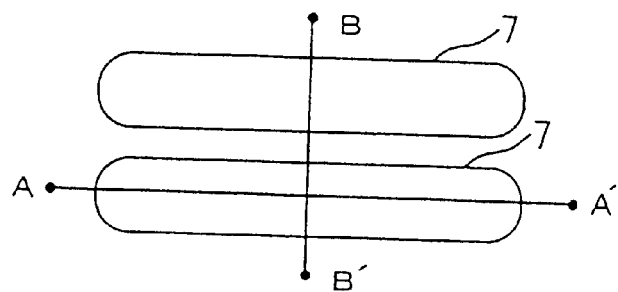
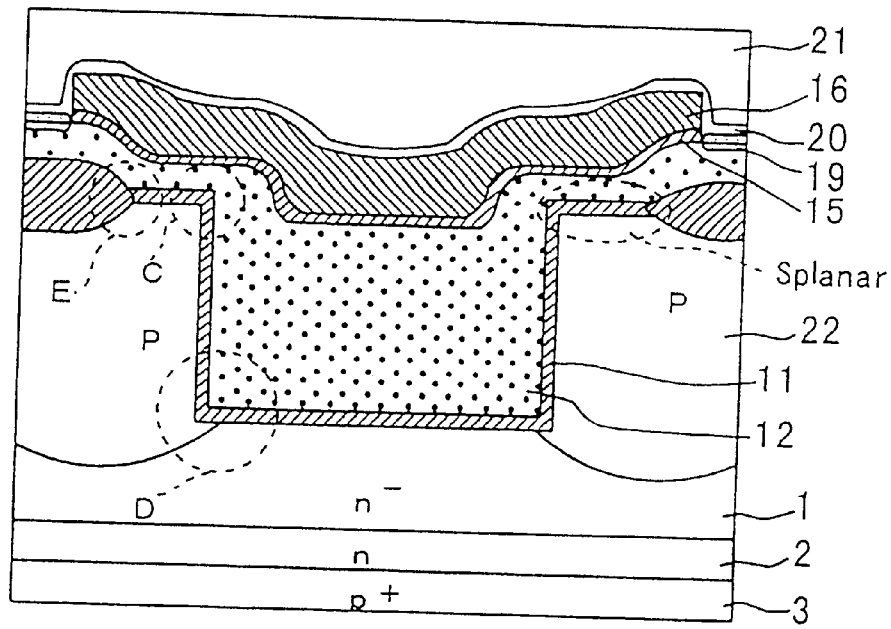
FIG.16(b)
FIG.16(c)
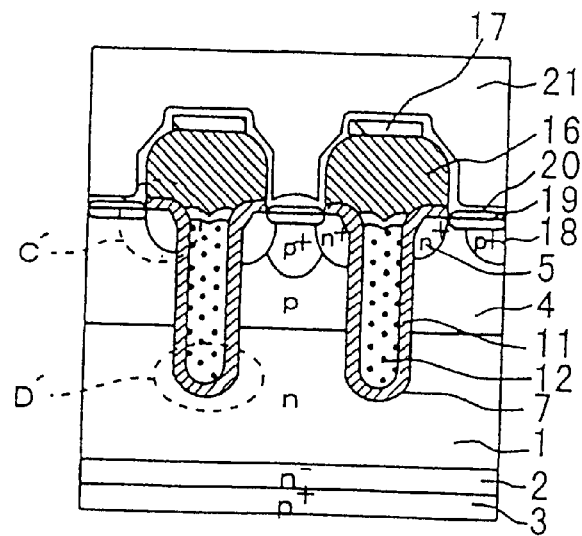

TRENCHED SEMICONDUCTOR DEVICE AND METHOD OF FABRICATING THE SAME

BACKGROUND OF THE INVENTION

1. Technical Field

The present invention relates to a semiconductor device employing a trench structure as a MOS gate, and a method of fabricating such a semiconductor device. More specifically, the present invention relates to a semiconductor device provided with gate oxide film formed on the walls of trenches and having improved characteristics, and a method of fabricating such a semiconductor device.

2. Background Art

FIG. 16 is an exemplary diagram of the construction of a conventional power device employing a trench as a MOS gate, such as an IGBT (insulated-gate bipolar transistor). FIG. 16(a) is a typical view of trenches, FIG. 16(b) is a sectional view of the power device taken on line A-A' aligned with the longitudinal axis of the trench in FIG. 16(a), and FIG. 16(c) is a sectional view of the power device taken on line B-B' extending across the trenches in FIG. 16(a).

Shown in FIG. 16 are an n− type diffused layer 1, an n type diffused layer 2, a p+ type heavily doped diffused layer 3, a p type base layer 4, a diffused n+ type emitter layer 5, trenches 7, a gate insulating film 11, a gate 12, a silicon dioxide film 15, interlayer insulating films 16 and 17, a p+ type region 18, a silicide layer 19, a barrier metal layer 20, and an aluminum layer 20. In this conventional trenched MOS gate construction, the surface of the gate 12 lies below a plane including the surface of a silicon wafer, i.e., below a plane including the tops of the trenches.

FIG. 17 shows, for comparison, a conventional planar MOS gate, in which parts like or corresponding to those shown in FIG. 16 are designated by the same reference numerals and the description thereof will be omitted.

FIGS. 18 to 20 are exemplary diagrams of the steps of fabricating a conventional power device employing a trench as a MOS gate, such as an IGBT (insulated-gate bipolar transistor).

The method will be described. As shown in FIG. 18(a), an n type region 2 and a p+ type region 3 are formed on the lower surface of an n− type region 1 of a semiconductor substrate 30, such as a silicon substrate, and a doped p type region 4 is formed on the upper surface of the n− type region 1. A heavily doped n+ type region 5 is formed selectively in portions of the doped p type region 4. Trenches 7 are formed through the p type doped region 4 and the n+ type regions 5. Then, the walls and top ends of the trenches 7 are smoothed.

As shown in FIG. 18(b), a gate insulating film 11 of silicon dioxide is formed so as to cover the walls of the trenches 7 and the surface of the wafer 30. The gate insulating film 11 is a silicon dioxide film.

As shown in FIG. 18(c), a low-resistance polysilicon film for forming gate electrodes 12 is deposited over the entire surface of the wafer 30 so as to fill up the trenches 7.

Then, as shown in FIG. 18(d), the polysilicon film is patterned to form the gate electrodes 12. A silicon dioxide film 15 is formed on the gate electrodes 12 as shown in FIG. 19(a).

Then, as shown in FIG. 19(b), CVD films 16 and 17 are deposited by CVD to form an interlayer insulating film over the entire surface of the wafer 30.

Then, the oxide films 16 and 17 are etched to form trenched MOS gates as shown in FIG. 19(c).

Then, as shown in FIG. 20, a silicide layer 19, a barrier metal layer 20 and an aluminum layer 21 are formed by sputtering and lamp annealing, and an electrode 22 is formed to complete a trenched IGBT.

In the conventional device of the construction as shown in FIG. 16 thus fabricated, a projection is formed along a Si/SiO2 boundary in a region C shown in FIG. 16(b). The thickness of portions of the gate insulating film 11 in the region C and a region D is reduced, which deteriorates the characteristics and reliability of the gate insulating film 11 formed on the walls of the trenches 7.

Since the n+ type emitter layer 5 and the p type base layer 4 are exposed on the sidewalls of the trenches 7, the impurities of the diffused layers diffuse into the gate insulating film 11 when forming the gate insulating film 11 in the process of FIG. 18(b). Consequently, the characteristics and reliability of the gate insulating film 11 deteriorate.

SUMMARY OF THE INVENTION

The present invention has been made to solve those problems and it is therefore an object of the present invention to provide a semiconductor device, such as a power device employing a trench as a MOS gate, of a device construction capable of improving the characteristics of an insulating film, such as a gate oxide film, formed on the walls of the trenches, and a method of fabricating such a semiconductor device.

According to one aspect of the present invention, a trenched semiconductor device comprises a semiconductor substrate provided with at least one trench in a major surface thereof. An insulating film is formed on the wall of the trench to extend onto the major surface of the semiconductor substrate. Further, a conductive part is filled up in the trench to extend onto the insulating film on the major surface of the semiconductor substrate.

In another aspect of the present invention, the thickness of the portion of the insulating film is increased preferably at the top portion of the trench so that the thickness of the portion of the conductive part is reduced preferably at the top portion of the trench.

In another aspect of the present invention, the insulating film is continuously formed in the adjacent trenches and on the major surface of the semiconductor substrate therebetween, and the conductive part is continuously formed filling up the adjacent trenches and extending onto the insulating film on the major surface of the semiconductor substrate therebetween.

In another aspect of the present invention, a capacitor area of the portion of the insulating film, lying on the major surface of the semiconductor substrate, is 5% or above of a total capacitor area of the insulating film.

In another aspect of the present invention, a gate edge length of the portion of the insulating film, lying outside the trench, is 30% or above of a total gate edge length of the insulating film.

In another aspect of the present invention, the insulating film is composed of either a two-layer construction consisting of a thermal oxide film and a CVD film formed on the thermal oxide film, a two-layer construction consisting of a CVD film and a thermal oxide film formed on the CVD film, or a three-layer construction consisting of a thermal oxide film, a CVD film formed on the thermal oxide film, and a thermal oxide film formed on the CVD film.

In another aspect of the present invention, the conductive part contains implanted nitrogen.

In another aspect of the present invention, the semiconductor substrate is a silicon wafer, the insulating film is a silicon dioxide film, and the conductive part is made of polysilicon.

In another aspect of the present invention, the trench sidewall of the semiconductor substrate serves as a channel, the insulating film serves as a gate insulating film, and the conductive part serves as a gate.

According to another aspect of the present invention, a trenched semiconductor device comprises a semiconductor substrate provided with at least one trench in a major surface thereof. An insulating film is formed on the wall of the trench to extend onto the major surface of the semiconductor substrate. A conductive part is formed at least in the trench. Further, the thickness of the portion of the insulating film on the major surface of the semiconductor substrate is at least twice the thickness of the portion of the insulating film on the wall of the trench.

For reference, the trenched semiconductor device may be fabricated in either of the following methods.

In one fabricating method, at least one trench is formed in a major surface of a semiconductor substrate. An insulating film is formed on the wall of the trench and on the major surface of the semiconductor substrate. A conductive film is formed in the trench and over the major surface of the semiconductor substrate. A portion of the conductive film a predetermined distance apart from the trench is removed to leave a conductive film in the trench and on the insulating film surrounding the trench.

In another fabricating method, at least one trench is formed in a major surface of a semiconductor substrate. A first insulating film is formed over the wall of the trench and the major surface of the semiconductor substrate. A first conductive film is formed in the trench and on the major surface of the semiconductor substrate. A first conductive part is formed by removing the portion of the first conductive film at the upper portion of the trench and on the major surface of the semiconductor substrate. A second insulating film is formed over the entire surface of the major surface of the semiconductor substrate. At least an opening is formed through the second insulating film so as to reach the first conductive part formed in the trench, leaving the second insulating film over the first insulating film. Further, a second conductive part is formed in the opening so as to be connected to the first conductive part.

In another fabricating method, the insulating film and the conductive film are formed to extend continuously across the adjacent trenches.

In another fabricating method, an insulating film on the wall of the trench and the major surface of the semiconductor. substrate is formed so that the thickness of the portion of the insulating film, formed on the major surface of the semiconductor substrate, is not less than twice that of the portion of the insulating film formed on the wall of the trench.

Other and further objects, features and advantages of the invention will appear more fully from the following description.

BRIEF DESCRIPTION OF THE DRAWINGS

This invention will be described in further detail by way of some embodiments with reference to the accompanying drawings, in which the same reference numerals indicate the same or like parts.

FIGS. 13(a) to 13(b) and 14(a) to 14(d) show a method of fabricating a trenched semiconductor device and the construction thereof in a fourth embodiment according to the present invention.

FIGS. 16(a) to 16(c) show a construction of a conventional power device employing a trench as a MOS gate.

BEST MODE OF CARRYING OUT THE INVENTION

First Embodiment

FIGS. 1 to 6 are views of assistance in explaining the construction of a trenched semiconductor device and a method of fabricating the same trenched semiconductor device in a first embodiment according to the present invention. In the following description, the semiconductor device is supposed to be an IGBT having a trenched MOS gate.

First, the method of fabricating the IGBT is described, and then the construction of the IGBT is described.

FIGS. 1(a) to 6(b) are sectional views of a workpiece in different steps of a semiconductor device fabricating method, corresponding to the sectional view taken on line B-B' in FIG. 16(a) showing the trenches of the conventional semiconductor device in a plan view. FIG. 2(a) shows a step subsequent to that shown in FIG. 1(d), FIG. 3(a) shows a step subsequent to that shown in FIG. 2(d), FIG. 4(a) shows a step subsequent to that shown in FIG. 3(d), FIG. 5(a) shows a step subsequent to that shown in FIG. 4(d), and FIG. 6(a) shows a step subsequent to that shown in FIG. 5(b).

Figure 1A:
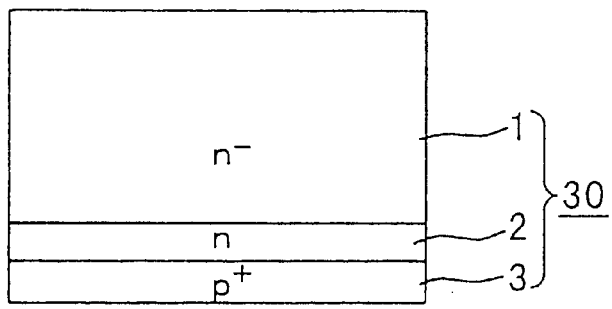
FIGS. 1(a–d), 2(a–d), 3(a–d), 4(a–d), 5(a–b) and 6(a–d) show a construction of a trenched semiconductor device and a method of fabricating the same in a first embodiment according to the present invention.

Referring to FIG. 1(a), a semiconductor substrate 30 has a lightly doped n– type diffused layer 1 (impurity concentration: $1\times10^{12}$ to $1\times10^{14}$ atoms/cm$^3$, depth of diffusion: 40 to 600 μm), an n type diffused layer 2 (peak impurity concentration: $1\times10^{18}$ atoms/cm$^3$ or below, depth of diffusion: 400 μm or below and not smaller than the depth of diffusion of a heavily doped p+ type diffused layer 3), the heavily doped p+ type diffused layer 3 (surface impurity concentration: $2\times10^{18}$ atoms/cm$^3$ or above, depth of diffusion: 1 μm or above and not greater than the depth of diffusion of the n type diffused layer 2). The diffused layers 1, 2 and 3 may be formed by, for example, implantation, diffusion or epitaxial growth.

Figure 1B:
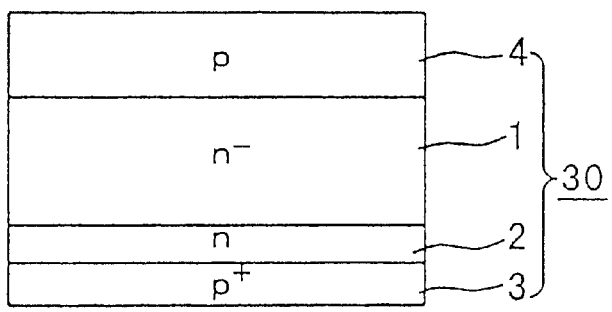

Referring to FIG. 1(b), a p type base layer 4 (peak impurity concentration: $1\times10^{15}$ to $1\times10^{18}$ atoms/cm$^3$, depth of diffusion: 1 to 4 μm and smaller than the depth of trenches) is formed by diffusion in the surface of the wafer 30, i.e., in the lightly doped n type diffused layer 1.

Figure 1C:
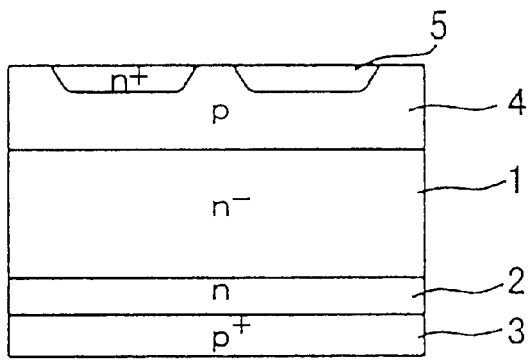

Then, as shown in FIG. 1(c), a diffused n+ type emitter layer 5 (surface impurity concentration: $1\times10^{18}$ to $5\times10^{20}$ atoms/cm$^3$, depth of diffusion: 0.3 to 2 μm) is formed. The reference numeral 30 indicating the semiconductor substrate will be omitted in FIG. 1(c) and those following FIG. 1(c) for simplicity.

Figure 1D:
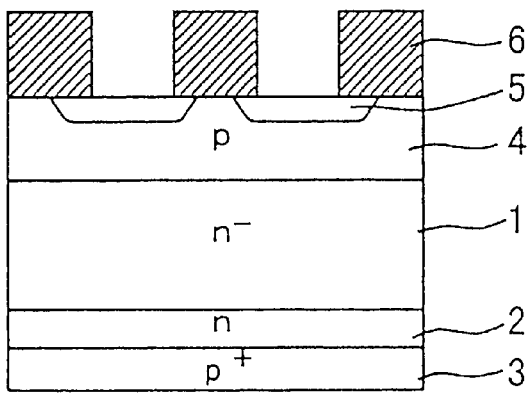

Referring to FIG. 1(d), an oxide film 6 is deposited by CVD, and then portions of the oxide film 6, corresponding to regions in which trenches 7 are to be formed are removed by etching.

Figure 2A:
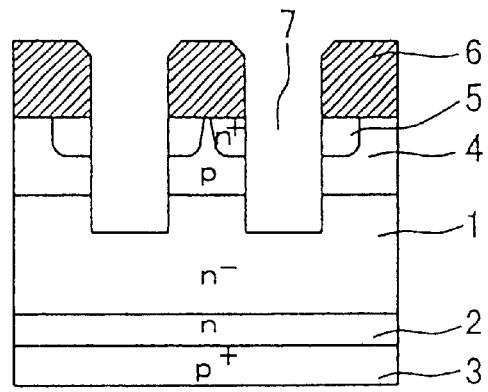

Then, the semiconductor substrate is etched using the oxide film 6 as a mask to form the trenches 7, as shown in FIG. 2(a).

Then, the workpiece is processed after forming the trenches 7 by etching to form trenched MOS gates having improved characteristics.

Figure 2B:
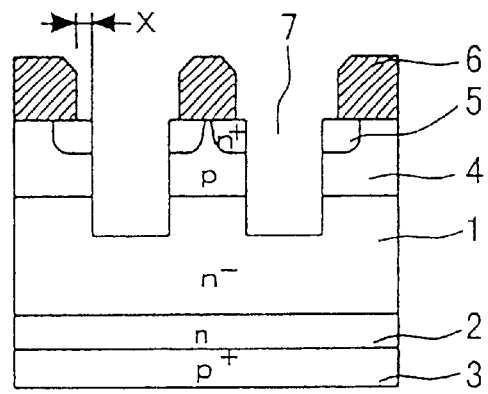

First, portions of the oxide film 6, around the tops of the trenches 7, are removed selectively so that the edges of the oxide film around the tops of the trenches 7, are separated by a distance x from the top edges of the trenches 7, as shown in FIG. 2(b).

Figure 2C:
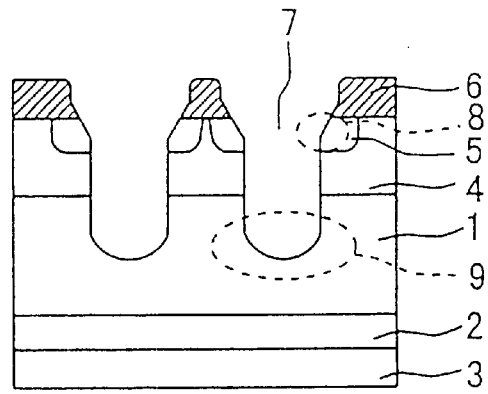

Then, the surface of the semiconductor substrate is subjected to an isotropic plasma etching process. Consequently, the edges 8 of the tops of the trenches 7 are made round, and the bottom walls 9 of the trenches 7 are etched in a round shape, as shown in FIG. 2(c).

Figure 2D:
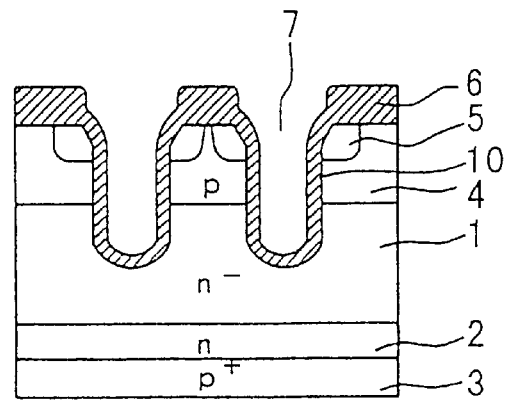
Figure 3A:
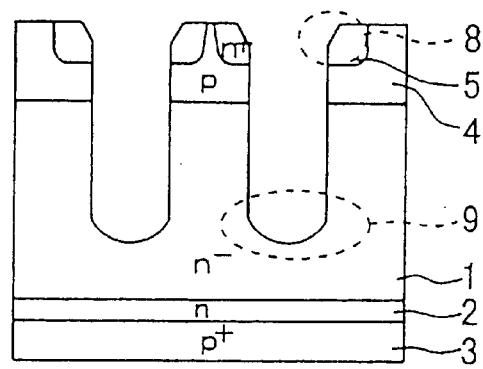

An oxide film 10 (a sacrifice oxide film) is formed as shown in FIG. 2(d), and then the oxide film 10 is removed as shown in FIG. 3(a).

Consequently, the edges 8 and the bottom walls 9 of the trenches 7 are rounded and the sidewalls of the trenches 7 are smoothed.

Figure 3B:
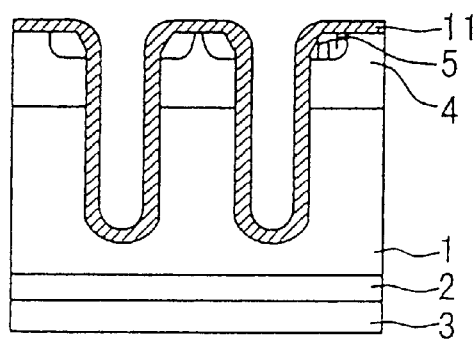

Then, a silicon dioxide film 11 (a first insulating film) is formed on the walls of the trenches 7 and the surface of the workpiece, as shown in FIG. 3(b). The silicon dioxide film serves as a gate insulating film 11.

Figure 3C:
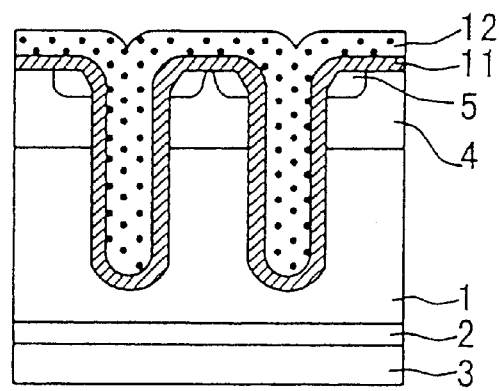

Then, the trenches 7 are filled up with a first conductive film 12 of a first gate electrode material, such as polysilicon heavily doped with phosphorus, for forming first gate electrodes, as shown in FIG. 3(c).

Figure 3D:
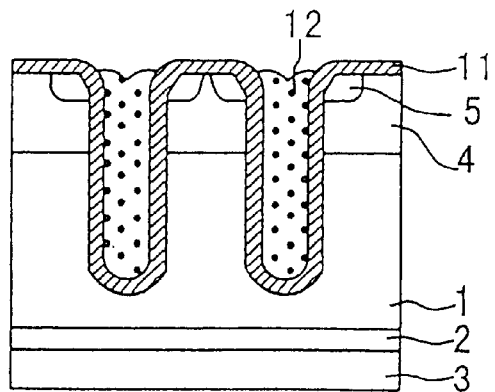

Then, the first conductive film 12 is etched so that portions of the first conductive film 12, covering the surface of the silicon wafer, are removed, and portions of the first conductive film 12, filling up the trenches 7 are etched so that the surfaces of the same portions of the first conductive film 12 lie below a plane including the surface of the silicon wafer, i.e., below a plane including the tops of the trenches 7, as shown in FIG. 3(d).

Figure 4A:
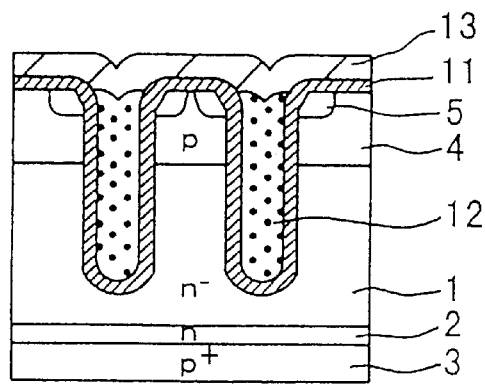

Then, a CVD film 13 (a second insulating film) is deposited as shown in FIG. 4(a).

Figure 4B:
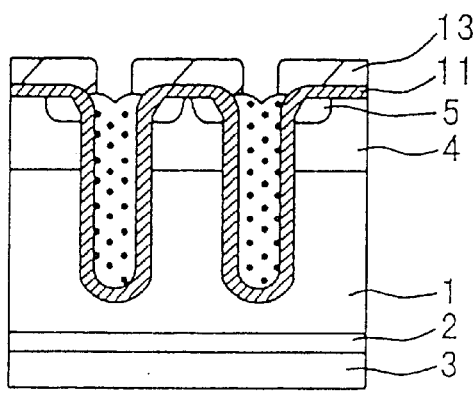

Then, as shown in FIG. 4(b), portions of the CVD film 13 corresponding to the trenches 7 are removed by etching so that the surface of the first conductive film 12 filling up the trenches 7 are exposed, leaving portions of the CVD film 13 covering the gate insulating film (silicon dioxide film) 11.

Figure 4C:
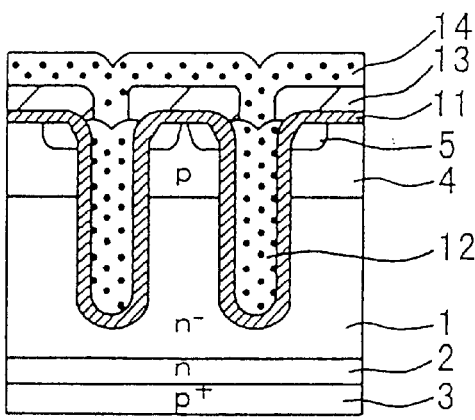

Then, as shown in FIG. 4(c), a second conductive film 14 of a second gate electrode material is formed so as to be connected to the first conductive film 12 in the trenches 7.

Figure 4D:
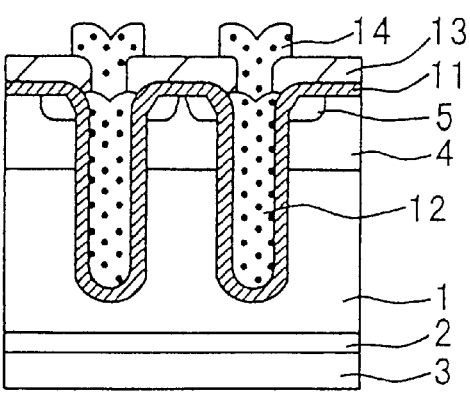

Then, as shown in FIG. 4(d), the second conductive film 14 of the second gate electrode material is patterned.

The first gate electrode material forming the first conductive film 12, and the second gate electrode material forming the second conductive film 14 are the same. A silicide layer, such as a TiSi layer or a CoSi layer, may be formed on the surface of the first conductive film 12 to reduce gate resistance at the stage shown in FIG. 4(b) before depositing the second conductive film 14.

Figure 5A:
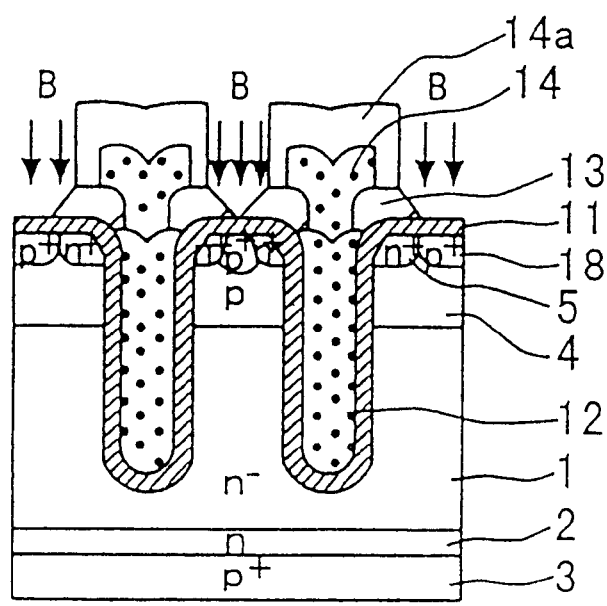

Then, as shown in FIG. 5(a), the second conductive film 14 is coated with a resist film 14a, the CVD film 13 is patterned by etching, and then p+ type regions 18 are formed by ion implantation.

Figure 5B:
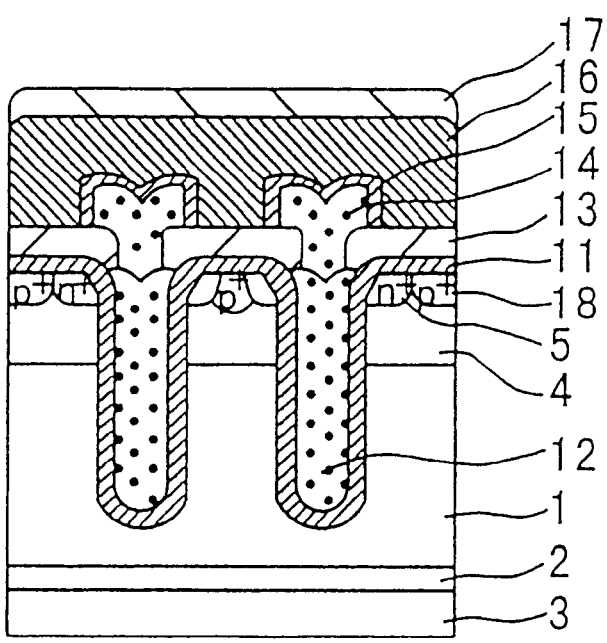

Then, as shown in FIG. 5(b), the surface of the second conductive film 14 is oxidized to form an oxide film 15, and interlayer insulating films 16 and 17, such as a CVD film or a silicate glass film containing boron or phosphorus, are formed.

Figure 6A:
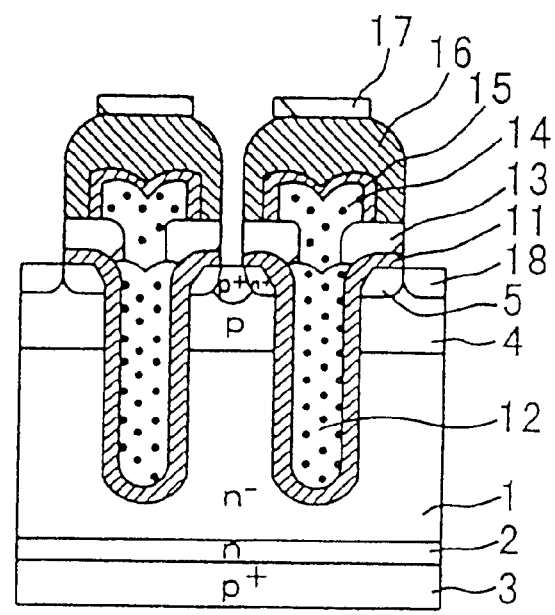
Figure 6B:
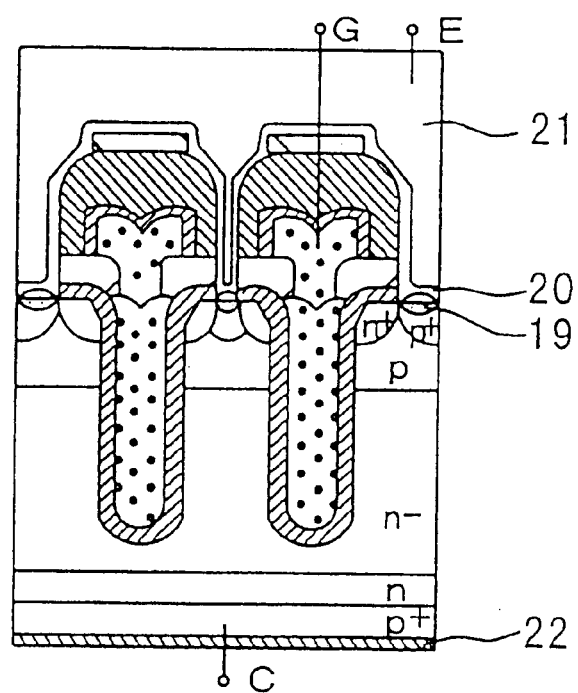

Then, the films 11, 13, 16 and 17 are patterned to form contacts as shown in FIG. 6(a), and then as shown in FIG. 6(b), a silicide layer 19, a barrier metal layer 20 and an aluminum film 21 are formed by sputtering and lamp annealing. An electrode 22 is formed on the lower surface of the semiconductor substrate to complete an IGBT of a trenched MOS gate construction.

FIG. 6(b) shows the IGBT of a trenched MOS gate construction fabricated in a sectional view as an example of the semiconductor device in the first embodiment.

In brief, this semiconductor device in the first embodiment comprises the trenches 7 formed in the major surface of the semiconductor substrate 30. The gate insulating films 11 and 13 coating the walls of the trenches 7 and extend onto the major surface of the semiconductor substrate 30, having portions of an increased thickness extending around the tops of the trenches 7. The gate formed by patterning the first conductive film 12 and the second conductive film 14, and the gate has a portion of a reduced thickness on the top of the trench 7.

Alternatively, the construction of the semiconductor device in the first embodiment may be expressed as follows. The semiconductor device in the first embodiment comprises the trenches 7 formed in the major surface of the semiconductor substrate 30. The first gate insulating film 11 coats the walls of the trenches 7 and the major surface of the semiconductor substrate 30, and the first conductive film 12 fills the trenches 7 up to a position below a plane including the tops of the trenches 7. The second insulating film 13 is formed on the first gate insulating film 11, extending over the peripheral portions of the first conductive film 12 formed in the trenches 7 and the major surface of the semiconductor substrate 30. The second conductive film 14 is connected through openings formed in the second insulating film 13 to the first conductive film 12, and lay on portions of the surface of the second insulating film 13.

The semiconductor device fabricating method for fabricating the semiconductor device in the first embodiment may be summarized as follows. First, the plurality of trenches 7 are formed in the major surface of the semiconductor substrate 30. The first gate insulating film 11 which serves as a gate insulating film is formed on the walls of the trenches 7 and the major surface of the semiconductor substrate 30. The first conductive film 12 is formed on the major surface of the semiconductor substrate 30 so as to fill up the trenches 7. The first conductive film 12 is etched so that portions covering the surface of the silicon wafer 30 are removed. Portions of the first conductive film 12 filling up the trenches 7 are etched so that the surfaces of the same portions lie below a plane including the tops of the trenches 7, forming lower portions of the gates. The second insulating film 13 is deposited over the entire major surface of the semiconductor substrate 30. Portions of the second insulating film 13 (corresponding to the trenches 7) are removed by etching. Hence, a portion of the second insulating film 13 covering the first gate insulating film 11 form openings reaching the first conductive film 12, filling the trenches 7. The second conductive film 14 is formed through the openings so as to be connected to the first conductive film 12 in the trenches 7, completing the trenched semiconductor device.

If the trenched MOS gate structure thus formed is employed, any projection is not formed in the Si/SiO2 interface in the trenches. That is, any structure that deteriorates the leakage characteristics of the gate oxide film formed on the walls of the trenches is not formed. Consequently, the leakage characteristics of the gate oxide film are improved.

Second Embodiment

Figure 7A:
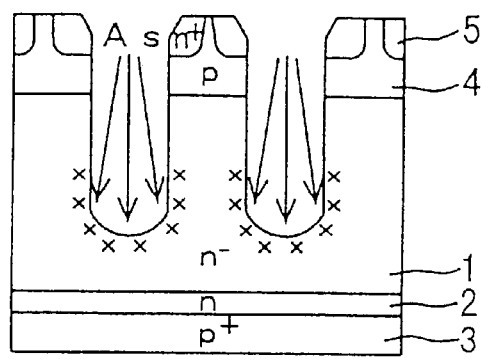
FIGS. 7(a) to 7(c), 8(a) to 8(c) and 9 show a method of fabricating a trenched semiconductor device and the construction thereof in a second embodiment according to the present invention.
Figure 8A:
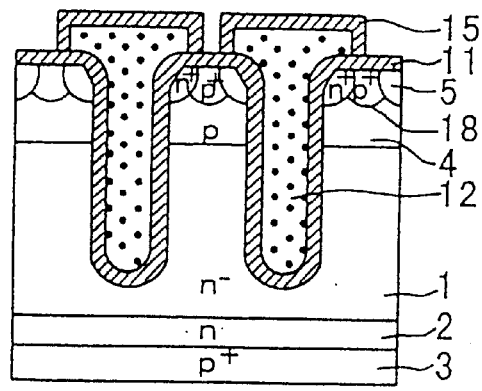
Figure 8B:
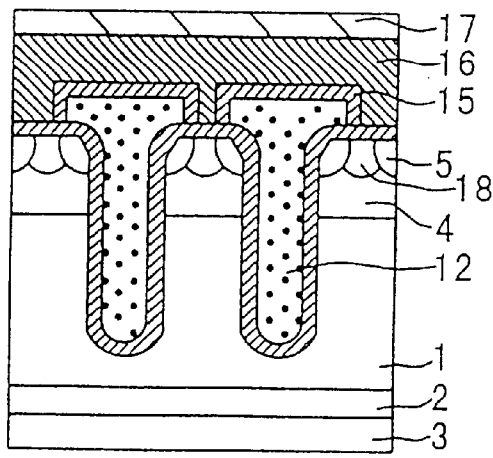
Figure 8C:
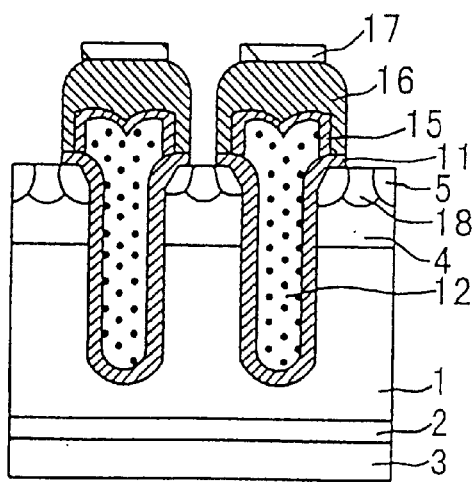
Figure 9:
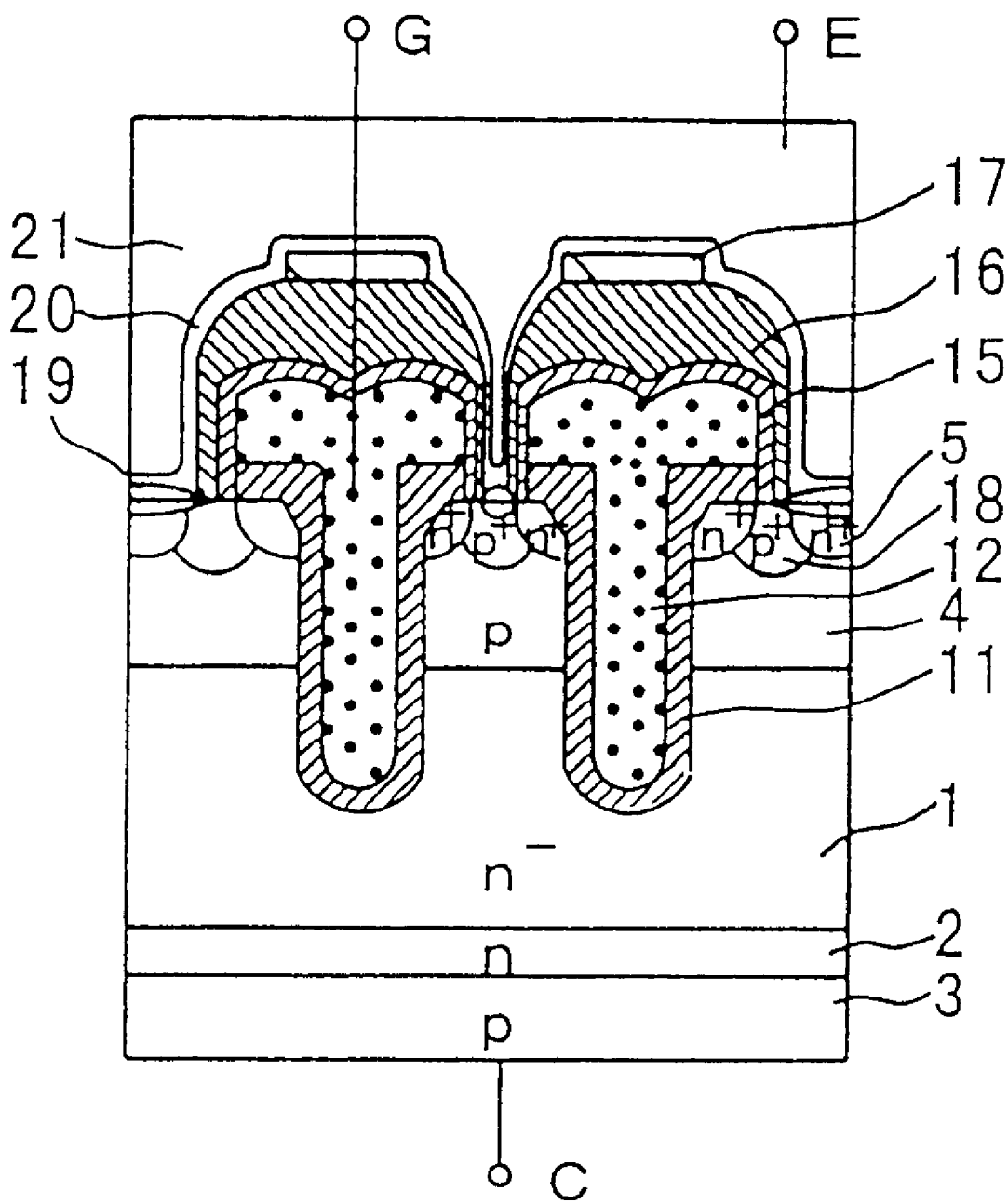

FIGS. 7 to 9 are exemplary diagrams of a method of fabricating a trenched semiconductor device and the construction thereof in a second embodiment according to the present invention. Steps for processing a workpiece to obtain the workpiece in a state shown in FIG. 7(a) are the same as those for fabricating the semiconductor device in the first embodiment shown in FIGS. 1 and 2.

First, the semiconductor device fabricating method is described, and then the construction of the semiconductor device is described.

Processes similar to those previously described with reference to FIGS. 1 and 2 are carried out.

As shown in FIG. 7(a), the bottom walls of the trenches 7 are doped with arsenic in an impurity concentration lower than that of the p type base layer 4 and higher than that of the n− type region 1, after forming the trenches 7 or after completing the after-treatment of the trenches 7.

Figure 7B:
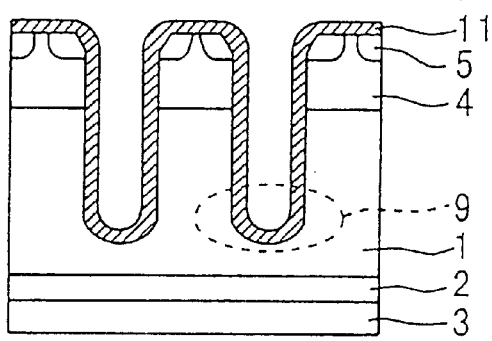

Then, a silicon dioxide film 11 (an insulating film) is deposited on the walls of the trenches 7 and the major surface of the semiconductor substrate, as shown in FIG. 7(b). The silicon dioxide film 11 will serve as a gate oxide film.

Thus, reduction in the thickness of a portion of the gate insulating film 11 covering the bottom wall 9 of each trench 7 can be avoided by accelerated oxidation. Furthermore, the uniformity of the thickness of the gate insulating film 11 on the walls of the trenches 7 is improved, which is expected to affect the characteristics of the gate oxide film favorably.

Figure 7C:
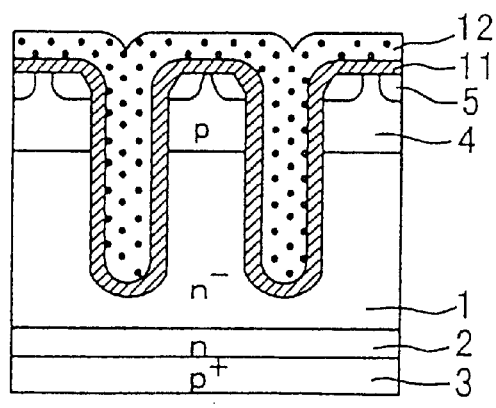

Then, a conductive film 12 of a gate electrode material, such as polysilicon heavily doped with phosphorus, is formed on the major surface of the semiconductor substrate so as to fill up the trenches 7, as shown in FIG. 7(c).

Then, the conductive film 12 is etched to leave a projected portion, removing portions thereof other than those corresponding to the trenches 7, as shown in FIG. 8(a). Also formed in the major surface of the semiconductor substrate by ion implantation are p+ type regions 18. The surface of the conductive film 12 is oxidized to form an oxide film 15.

Then, interlayer insulating films 16 and 17, such as CVD films or silicate glass films containing boron or phosphorus, are formed as shown in FIG. 8(b).

Then, the films 11, 16 and 17 are patterned, as shown in FIG. 8(c).

Then, a silicide layer 19, a barrier metal film 20 and an aluminum film 21 are formed by sputtering and lamp annealing to complete an IGBT of a trenched MOS gate construction, as shown in FIG. 9.

In the above, a semiconductor device fabricating method is explained in which an impurity is diffused into the bottom walls of the trenches for fabricating a semiconductor device having gates projecting from the tops of the trenches. However, the effect of diffusion of an impurity into the bottom walls of the trenches is not dependent on the construction of the gates, and the diffusion of an impurity into the bottom walls of the trenches can be effectively applied to semiconductor devices of the conventional gate construction or the semiconductor device of the gate construction, as shown in the first embodiment of the present invention.

The construction of the second embodiment and the method of fabricating the same can be summarized as follows. The semiconductor device in the second embodiment comprises the semiconductor substrate 30 provided in its major surface with the trenches 7. The gate insulating film 11 coats the walls of the trenches 7 and extends onto the major surface of the semiconductor substrate 30. The conductive film 12 fills up the trenches 7 and projects from the tops of the trenches 7, i.e., projecting from a plane including the major surface of the semiconductor substrate 20.

The method of fabricating the semiconductor device in the second embodiment forms the trenches 7 in the major surface of the semiconductor substrate 30, forms the gate insulating film 11 on the walls of the trenches 7 extending to the major surface of the semiconductor substrate 30, forms the conductive film 12 in the trenches 7 and on the major surface of the semiconductor substrate 30, and leaves the conductive film 12 in the trenches to extend over the major surface of the semiconductor substrate 30 by etching the conductive film 12 apart a predetermined distance from the trenches on the major surface of the semiconductor substrate 30. Thus, a semiconductor device having trench structures is fabricated.

The semiconductor device in the second embodiment thus fabricated has the gate insulating film 11, i.e., gate oxide film, coating the walls of the trenches 7 and extending onto the major surface of the semiconductor substrate 30, and the conductive film 12, i.e., gates, filling up the trenches 7 and projecting from the trenches 7. Therefore, the concentration of current flowing through the gate insulating film 11 on the tops of the trenches can be avoided, improving the reliability of the gate insulating film 11.

In the semiconductor device in the second embodiment, the bottom walls of the trenches 7 are doped with an impurity, such as arsenic, by ion implantation and then the gate insulating film 11 is formed. The portions of the gate insulating film 11 covering the bottom walls of the trenches 7 have a sufficient thickness.

In the method of fabricating the semiconductor device in the second embodiment, the trenches 7 are formed in the major surface of the semiconductor substrate 30, an impurity is implanted into the bottom walls of the trenches 7, and the gate insulating film 11 is formed on the walls of the trenches 7. The processes following the process of forming the gate insulating film 11 are the same as those of the conventional semiconductor device fabricating method.

The trenched MOS gate structure thus formed improves the uniformity of the thickness of the portions of the gate insulating film coating the walls of the trenches, and improves the characteristics of the gate insulating film.

Third Embodiment

Figure 10A:
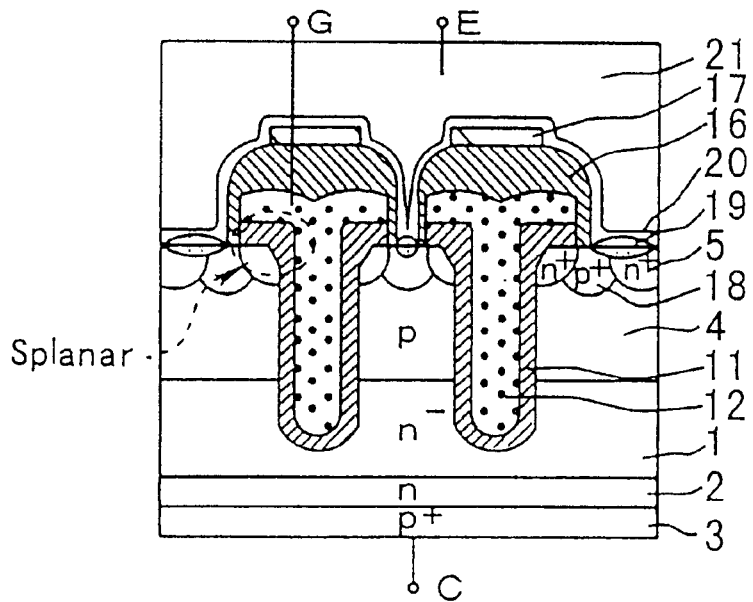
FIGS. 10(a) and 10(b) show a construction of a semiconductor device in a third embodiment according to the present invention.
Figure 10B:
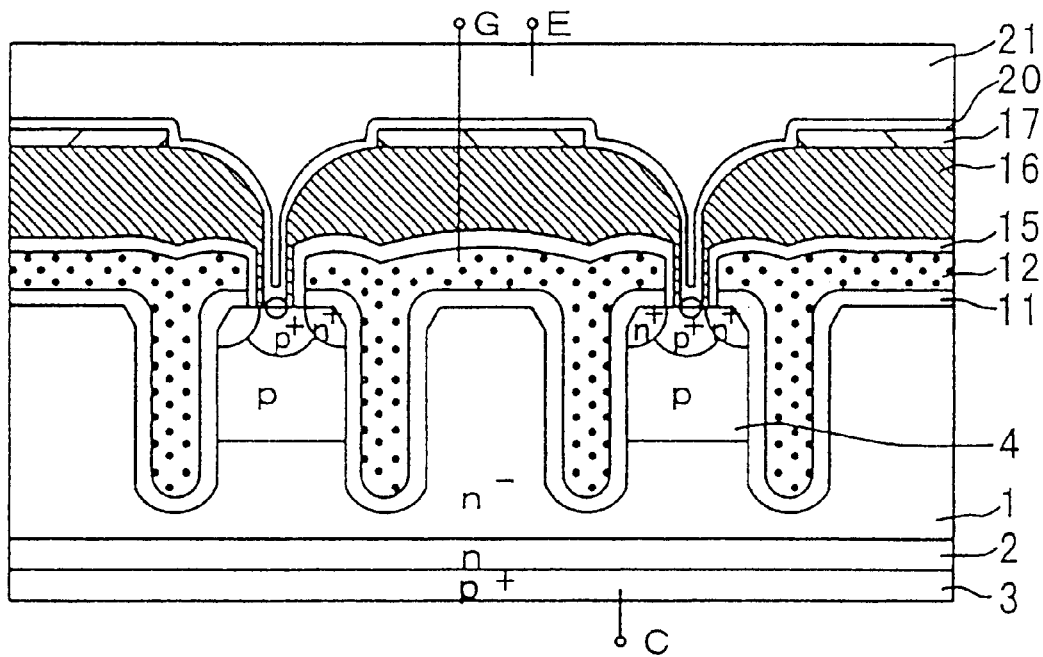
Figure 11:
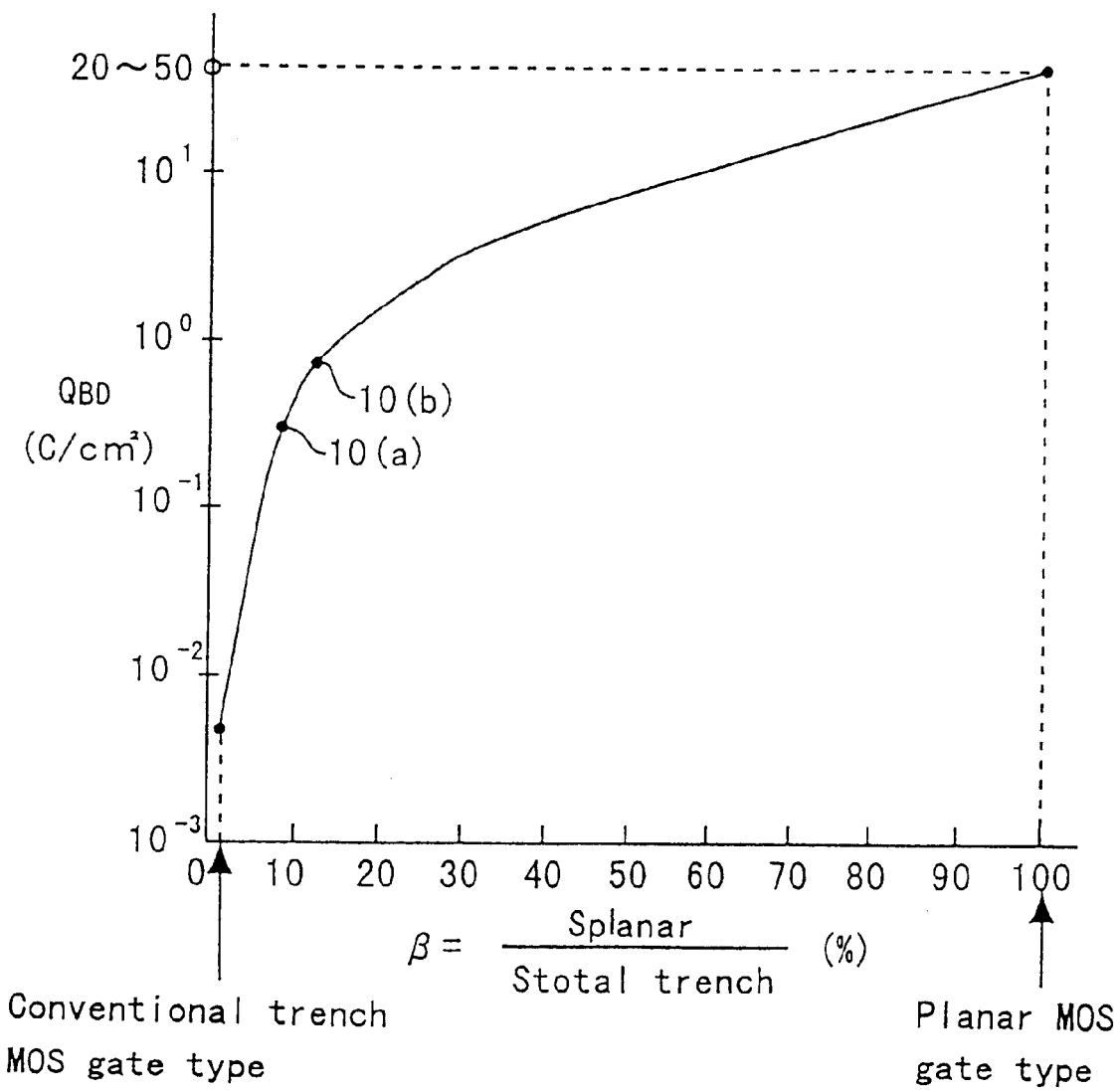
FIGS. 11 and 12 show the operation of the semiconductor device in the third embodiment according to the present invention.
Figure 12:
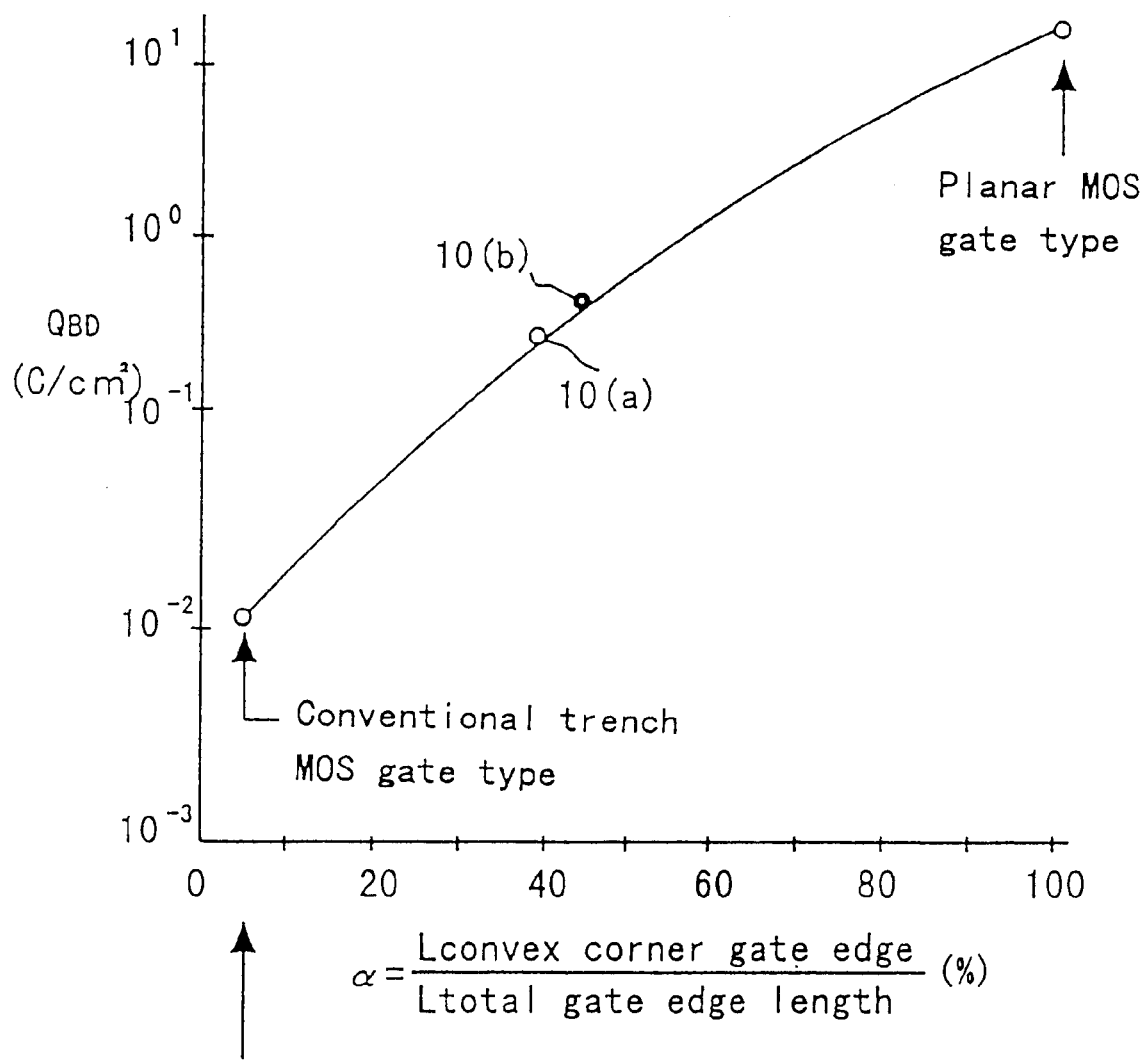

FIGS. 10(a) and 10(b) are exemplary diagrams of the construction of a semiconductor device in a third embodiment according to the present invention, and FIGS. 11 and 12 are exemplary diagrams of the operation of the semiconductor device in the third embodiment.

FIG. 10(a) shows a first example of the semiconductor device in the third embodiment of a construction based on the same conception as that on which the trenched MOS gate construction of the second embodiment is based. In this semiconductor device, a gate insulating film 11 coats the walls of trenches 7 and extends onto the portions of the major surface of a semiconductor substrate around the tops of the trenches 7. A conductive film 12, which forms gates, fills up the trenches 7, projects from the trenches 7 and extends on portions of the gate insulating film 11 around the tops of the trenches 7 to the same length.

FIG. 10(b) shows a second example of the semiconductor device in the third embodiment. In a trenched MOS gate construction employed in this semiconductor device, similar to that of the second embodiment, a gate insulating film 11 extends continuously across adjacent trenches 7, and a conductive film 12 forming gates is formed continuously across the adjacent trenches 7. Parts shown in FIG. 10(b) like or corresponding to those of the second embodiment are designated by the same reference numerals. Accordingly, further description of the semiconductor device shown in FIG. 10(b) will be omitted.

In this third embodiment, the conductive film 12 (forming the gates) is formed so as to fill up the trenches and to project from the trenches so as to lie above a plane including the surface of the semiconductor substrate, differing from the conventional trenched MOS gate construction. Therefore, the ratio β of the capacitor area (S-planar section in FIG. 10(a)) of the portion of the gate insulating film 11 on the surface of the semiconductor substrate to the total capacitor area (S-total trench) of the gate insulating film 11 coating the walls of the trenches and the surface of the semiconductor substrate increases. In contrast, in the conventional trenched MOS gate construction, the flat portion lies only in an S-planar section shown in FIG. 16.

Similar to the capacitor area, the ratio a of the gate edge length on the surface of the semiconductor substrate to the total gate edge length in the trenched MOS gate constructions shown in FIGS. 10(a) or 10(b) is greater than in the conventional trenched MOS gate construction.

FIGS. 11 and 12 are graphs showing the variation of the quantity Qbd of electric charge accumulated before the gate insulating film is broken with the capacitance ratio α and the edge length ratio α, respectively. The quantity Qbd of electric charge indicates the quantity of electric charge which can be accumulated before the electric breakdown of the gate insulating film occurs, and is a parameter indicating the reliability of the gate insulating film. Gate insulating films having a greater Qbd have higher film quality and higher reliability.

It is known from FIG. 11 that Qbd for the trenched MOS gate constructions shown in FIGS. 10(a) or 10(b) increases more sharply with the increase of the capacitance ratio β than Qbd for the conventional trenched MOS gate construction. While the capacitance ratio β of the conventional trenched MOS gate construction is on the order of 2%, the capacitance ratio β of the trenched MOS gate construction in the third embodiment is about 10%. It is known from the graph of FIG. 11 that Qbd for the trenched MOS gate construction of the third embodiment will be ten times Qbd for the conventional trenched MOS gate construction or greater, if the gate insulating film 11 and the conductive film 12 are formed so that the capacitance ratio β is 5% or above.

It is known from FIG. 12 that Qbd for the trenched MOS gate constructions shown in FIGS. 10(a) or 10(b) increases more sharply with the increase of edge length ratio a than Qbd for the conventional trenched MOS gate construction. While the edge length ratio α of the conventional trenched MOS gate construction is on the order of 5%, the edge length ratio β of the trenched MOS gate construction in the third embodiment is about 40%. It is known from the graph of FIG. 12 that Qbd for the trenched MOS gate construction of the third embodiment will be ten times Qbd for the conventional trenched MOS gate construction or greater, if the gate insulating film 11 and the conductive film 12 are formed so that the edge length ratio α is 30% or above.

The characteristics shown in FIGS. 11 or 12 are attributed to the following fact. The current which flows through the gate insulating film is concentrated on the tops of the trenches, and current density in the tops of the trenches is reduced if the ratio of the area of the tops of the trenches to the total capacitor area is reduced. In FIGS. 11 or 12, points corresponding to β=100% or α=100% are those for the conventional planar MOS gate construction.

A method of fabricating the semiconductor device shown in FIG. 10(a) is substantially the same as that of fabricating the semiconductor device in the second embodiment, and hence the description thereof will be omitted.

A method of fabricating the semiconductor device shown in FIG. 10(b) is basically the same as that of fabricating the semiconductor device in the second embodiment, except that the former method forms the conductive film 12 continuously across the two trenches 7 in the step illustrated in FIG. 8(a), and hence the further description thereof will be omitted. The method of fabricating the semiconductor device shown in FIG. 10(b) may omit the step illustrated in FIG. 7(a).

In brief, the semiconductor device in one example of the third embodiment comprises the gate insulating film 11 coating the walls of the trenches 7 and extending onto the major surface of the semiconductor substrate 30, and the conductive film 12 filling up the trenches 7 and extending over the entire portions of the gate insulating film 11 to the same length, extending on the major surface of the semiconductor substrate 30.

In the semiconductor device in another example of the third embodiment, the gate insulating film 11 and the conductive film 12 are formed so as to extend continuously across the adjacent trenches 7.

The semiconductor device in another example of the third embodiment is of a trenched MOS gate construction in which the ratio of the capacitor area of the tops of the trenches to the total capacitor area is large. Preferably, the capacitor area, of the portion of the gate insulating film outside of the trench on the major surface of the semiconductor substrate, is 5% or above the total capacitor area of the total gate insulating film.

The semiconductor device in another example of the third embodiment is of a trenched MOS gate construction in which the gate insulating film is formed so that the gate edge length, of the portion of the gate insulating film outside of the trench on the major surface of the semiconductor substrate, is 30% or above a total gate edge length of the insulating film.

The third embodiment improves the reliability of the gate insulating film.

Fourth Embodiment

FIGS. 13 and 14 are exemplary diagrams of the construction and a method of fabricating a trenched semiconductor device in a fourth embodiment according to the present invention. Steps of the semiconductor device fabricating method to provide a workpiece in a state shown in FIG. 13 are the same as those shown in FIGS. 1(a) to 2(d), illustrating steps of the method of fabricating the semiconductor device in the first embodiment, and hence the description thereof will be omitted.

First, the semiconductor device fabricating method is described, and then the construction of the semiconductor device is described.

In the fabricating method, the steps shown in FIGS. 1(a) to 1(c) are carried out.

In the step shown in FIG. 1(d), a CVD film 6 thicker than those of the first and the second embodiment is deposited, and openings are formed in portions of the CVD film 6 corresponding to trenches 7.

Then, the same steps as those shown in FIGS. 2(a) to 2(d) are carried out. At this stage, the fourth embodiment differs from the first embodiment in that the CVD film 6 is thicker than that of the first embodiment.

Figure 13A:
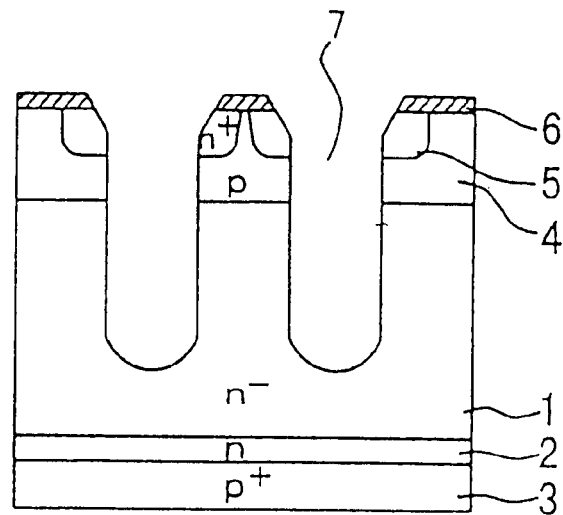

A workpiece in a state shown in FIG. 13(a) is obtained by removing an oxide film 10 of the workpiece in a state shown in FIG. 2(d). Since the CVD film 6 is relatively thick, the CVD film 6 remains partly on the surface of the semiconductor substrate after the oxide film 10 has been removed.

Figure 13B:
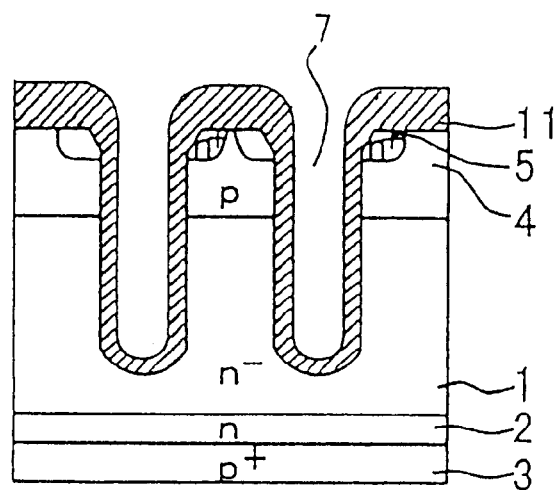

Then, as shown in FIG. 13(b), a gate insulating film 11 is formed. Portions of the gate insulating film 11 extending on the surface of the semiconductor substrate are united with the CVD film 6, having an increased thickness. The gate insulating film 11 is formed so that the thickness of the portions of the gate insulating film, formed on the surface of the semiconductor substrate, is twice the thickness of portions of the same formed on the walls of trenches or above.

Steps following the step illustrated in FIG. 13(b) may be the same as the corresponding steps of the conventional semiconductor device fabricating method or the step as illustrated in FIG. 7(c), and the succeeding steps of the method of fabricating the semiconductor device in the second embodiment, and not restricted.

Thus, the method of fabricating the semiconductor device in the fourth embodiment is characterized by the use of the CVD film 6 of a thickness greater than those of the CVD films of the semiconductor devices in the first or the second embodiment as a mask for use in an etching process for forming the trenches.

FIGS. 14(a) to 14(d) are sectional views of semiconductor devices in examples of the fourth embodiment fabricated by the foregoing semiconductor device fabricating method. FIG. 14(a) is a sectional view of a semiconductor device in which the upper surfaces of gates formed by depositing a conductive film 12 in trenches 7 lie below a plane including the tops of the trenches 7, FIG. 14(b) is a sectional view taken on the longitudinal axis of the trench 7 of the semiconductor device of FIG. 14(a), FIG. 14(c) is an enlarged view of a portion of the semiconductor device indicated at "A" in FIG. 14(a), and FIG. 14(d) is a sectional view of a semiconductor device provided with gates formed by depositing a conductive film 12 in trenches 7 and projecting from the tops of the trenches 7.

As is known from FIG. 14(c) showing the portion "A" in an enlarged sectional view, the semiconductor device in the fourth embodiment is characterized in that the thickness tgo×1 of a portion of the gate insulating film 11, formed on the surface of the semiconductor substrate, is twice the thickness tgo×2 of a portion of the gate insulating film 11, formed on the sidewall of the trench 7, or greater.

Consequently, the intensity Ecor,y of a vertical electric field, i.e., an electric field in a Y-direction, in a region around the edge of the trench 7 is lower than that of a vertical electric field when the thickness tgo×1 of a portion of the gate insulating film 11, formed on the surface of the semiconductor substrate is equal to the thickness tgo×2 of a portion of the gate insulating film 11, formed on the sidewall of the trench 7. Therefore, the total intensity Ecor, i.e., the sum of the intensities of electric fields in the X- and the Y-direction in the portion around the edge of the trench 7 is lower than that in the conventional semiconductor device.

Accordingly, an electric field of a reduced intensity is applied to portions of the gate insulating film 11, around the edges of the trenches 7, so that the characteristics of the gate insulating film 11 are improved, and the yield is increased.

Fifth Embodiment

The construction of a semiconductor device in a fifth embodiment according to the present invention and a method of fabricating the same will be described.

First, the semiconductor device fabricating method is described, and then the construction is described. FIGS. 1(a) to 3(b) in the first embodiment will be used to show the processes for fabricating the semiconductor device in this fifth embodiment.

First, processes similar to those illustrated in FIGS. 1(a) to 3(b) are carried out to form trenches 7 in a semiconductor substrate 30, as shown in FIG. 3(a).

The method of fabricating the semiconductor device in the fifth embodiment is characterized by a process of forming a gate insulating film 11 on the walls of the trenches 7, as shown in FIG. 3(b).

The gate insulating film 11 of the fifth embodiment is a two-layer film formed by forming an oxide film by thermal oxidation, and depositing a CVD film on the oxide film. It is also possible to form the gate insulating film 11 of a two-layer construction by first depositing a CVD film, and then forming a surface oxide film by thermal oxidation of the CVD film.

The gate insulating film 11 may be a three-layer film consisting of a thermal oxide film formed by thermal oxidation, a CVD film deposited on the oxide film, and a surface oxide film formed by thermal oxidation of the CVD film.

When the gate insulating film 11 is thus formed, irregularity in thickness of portions of the gate insulating film, formed on the walls of the trenches is reduced, the thickness uniformity of the portions of the gate insulating film 11 formed on the walls of the trenches is improved, and adverse effects of irregularity in the thickness of the gate insulating film 11 can be avoided.

Since a channel may be formed in a portion of the surface of the semiconductor substrate covered with the gate insulating film 11, it is preferable to form an oxide film on the semiconductor substrate rather than on a CVD film, avoiding the reduction of mobility in the MOS channel.

Processes following the process of forming the gate insulating film 11 may be, for example, the same as those of forming the conventional semiconductor device, the process illustrated in FIGS. 3(c) and the succeeding processes, or the process illustrated in FIG. 7(c) and the succeeding processes.

In general, a gate insulating film is formed on the walls of a trench in an irregular thickness because of the following reasons. The walls of a trench have several surface orientation, and a gate insulating film 11 formed on the walls of the trench by the conventional thermal oxidation process inevitably has an irregular thickness due to surface orientation dependence.

In contrast, in the fifth embodiment, the gate insulating film 11 is formed by forming a CVD film on a thermal oxide film, or by forming a thermal oxide film on a CVD film to reduce irregularity in the thickness of the gate insulating film 11.

Further, the gate insulating film 11 of the fifth embodiment is effective in preventing the thinning (narrowing) of a portion of the gate insulating film 11 in the boundary between a LOCOS structure 23 (isolating oxide film) and the gate insulating film 11 shown in FIG. 16(b) Hence, it is effective in preventing the break down of the gate insulating film 11 in a region "E" and the deterioration of the characteristics of the gate insulating film.

Further, the method of fabricating the semiconductor device in the fifth embodiment may be used in place of the method which reduces irregularity in the thickness of the gate insulating film 11. This is accomplished by forming an n type layer on the bottom wall of the trench for accelerated oxidation. These methods are both effective in forming the gate insulating film with a uniform thickness.

In brief, the semiconductor device in the fifth embodiment has the trenches 7 formed in the major surface of the semiconductor substrate 30, the gate insulating film 11 formed by forming a thermal oxide film on the walls of the trenches 7 and depositing a CVD film on the thermal oxide film or by depositing a CVD film on the walls of the trenches 7 and forming a thermal oxide film on the CVD film, and the conductive film 12 filling the trenches 7.

As is apparent from the foregoing description, the semiconductor device in the fifth embodiment is provided with the gate insulating film 11 formed on the walls of the trenches, consisting of either (a) a thermal oxide film and a CVD film overlying the thermal oxide film, or (b) a CVD film and a thermal oxide film overlying the CVD film, or (c) a thermal oxide film, a CVD film overlying the thermal oxide film and a thermal oxide film overlying the CVD film, and the gate insulating film 11 has an improved uniform thickness and enhanced reliability.

Sixth Embodiment

A method of fabricating a semiconductor device in a sixth embodiment according to the present invention will be described with reference to FIGS. 1(a) to 3(c), illustrating the processes of fabricating the semiconductor device in the first embodiment.

The same processes as those shown in FIGS. 1(a) to 3(b) are carried out to form trenches 7 in a semiconductor substrate 30, and a gate insulting film 11 is formed on the walls of the trenches 7, as shown in FIG. 3(b).

The method of fabricating the semiconductor device in the sixth embodiment is characterized by a process of forming a conductive film 12 of a gate electrode forming material, as shown in FIG. 3(c).

As shown in FIG. 3(c), the conductive film 12 of, for example, polysilicon heavily doped with phosphorus, is formed so as to fill up the trenches 7. Subsequently, nitrogen ions are implanted into the conductive film 12 in a nitrogen concentration 0.1 to 2 times the impurity concentration of the diffused n+ type emitter layer 5.

Then, the conductive film 12 of a gate electrode material is etched as shown in FIG. 3(d) or FIG. 8(a). There is no particular restriction on processes following the process of etching the conductive film 12.

In the sixth embodiment, nitrogen is diffused into and segregated in the gate insulating film 11 when the conductive film 12 forming gates is annealed after implanting nitrogen ions therein. Hence, a nitrogen-rich oxide layer is formed between the gate insulating film 11 and the semiconductor substrate 30, or between the gate insulating film and the conductive film 12. Consequently, the diffusion of impurities from the n+ type emitter layer 5 and the p type base layer 5 into the gate insulating film 11 during annealing can be suppressed, and the deterioration of the characteristics of the gate insulating film 11 can be suppressed.

The conductive film 12 is nitrided by nitrogen implanted therein, and nitrogen atoms occupy dangling bonds and imperfect crystals in the interface between the gate insulating film 11 and the semiconductor substrate 30, reducing the occurrence of surface potential. Since Si—H and Si—PH bonds which act as electron traps in the gate insulating film 11 change into Si—N bonds, the number of electron traps in the gate insulating film 11 is reduced. Consequently, the hot carrier resistance of the trenched MOS gate transistor is enhanced.

Figure 20:
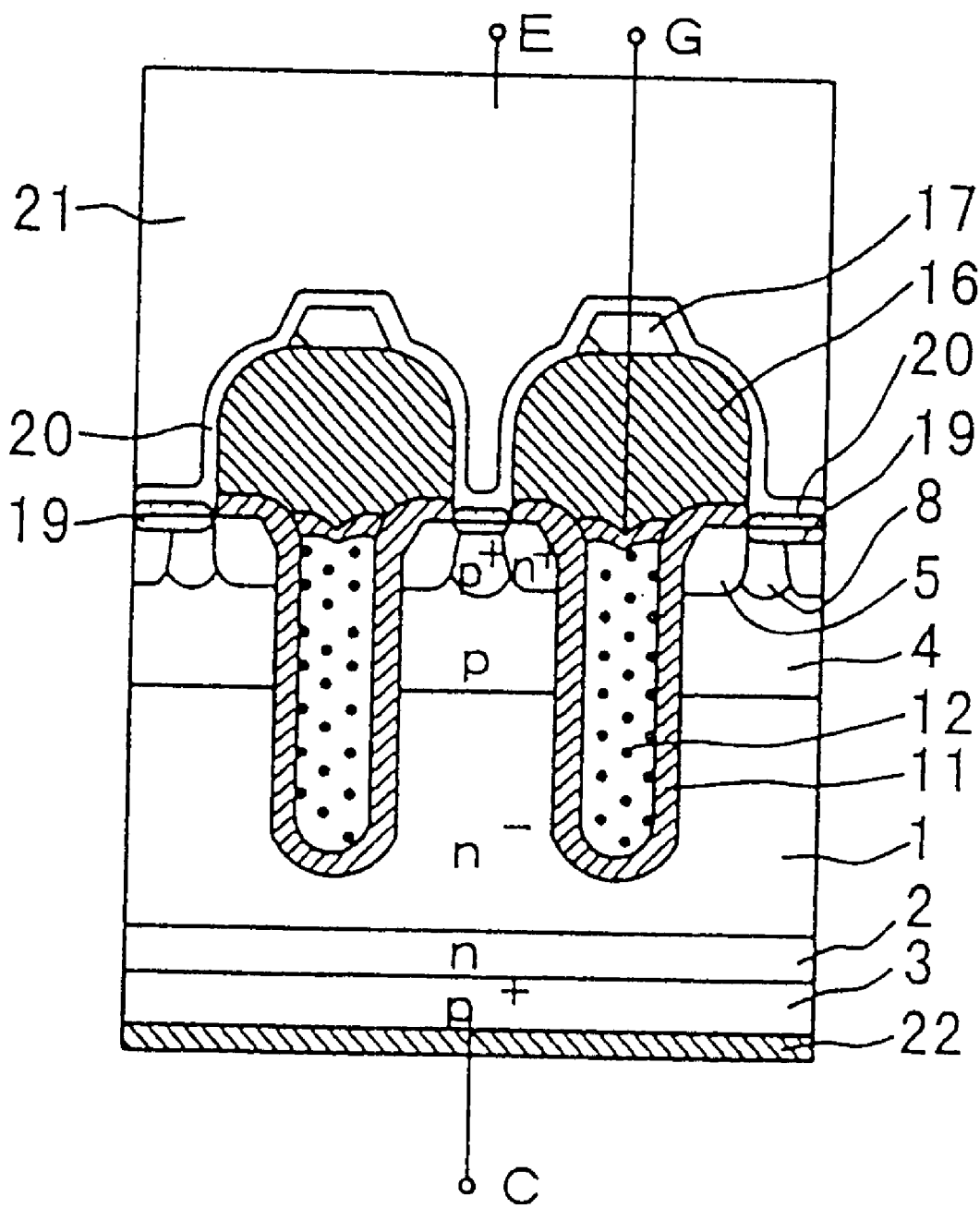

This method may be applied to the gate insulating film 11 formed by a thermal oxide film, a two-layer composite film constructed by depositing a CVD film on a thermal oxide film, a two-layer composite film constructed by forming a thermal oxide film on a CVD film or a three-layer composite film constructed by depositing a CVD film on a thermal oxide film and forming another thermal oxide film on the CVD film. The gate construction need not be limited to those of a trenched MOS gate construction, but may be those of a planar MOS gate construction, as sown in FIG. 20.

As is apparent from the foregoing description, the trenched semiconductor device in the sixth embodiment has the gates doped by nitrogen ion implantation.

The method of fabricating the semiconductor device in the sixth embodiment implants nitrogen ions in the conductive film for forming the gates to nitride a layer of the gate insulating film, contiguous with the semiconductor substrate. Consequently, the reliability of the gate insulating film formed on the walls of the trenches can be improved.

Seventh Embodiment

Figure 15A:
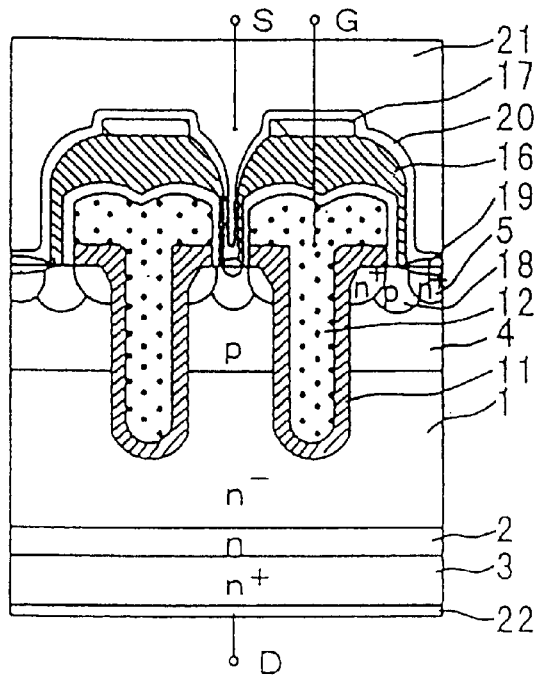
FIG. 15(a) is a sectional view of a trenched MOSFET employing the trenched MOS gate construction.
Figure 15B:
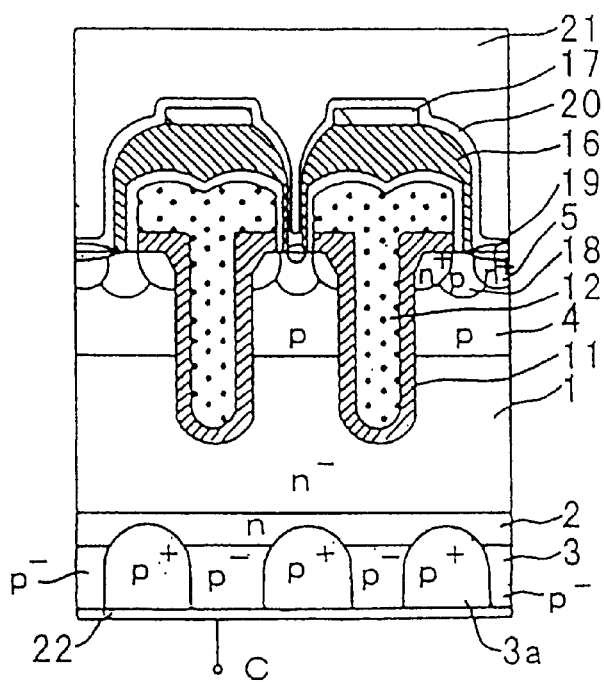
FIG. 15(b) is a sectional view of an IGBT employing the trenched MOS gate construction
Figure 15C:
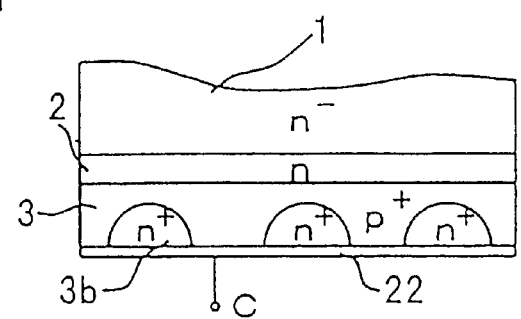
FIG. 15(c) is a fragmentary sectional view of another IGBT employing the trenched MOS gate construction.
Figure 17:
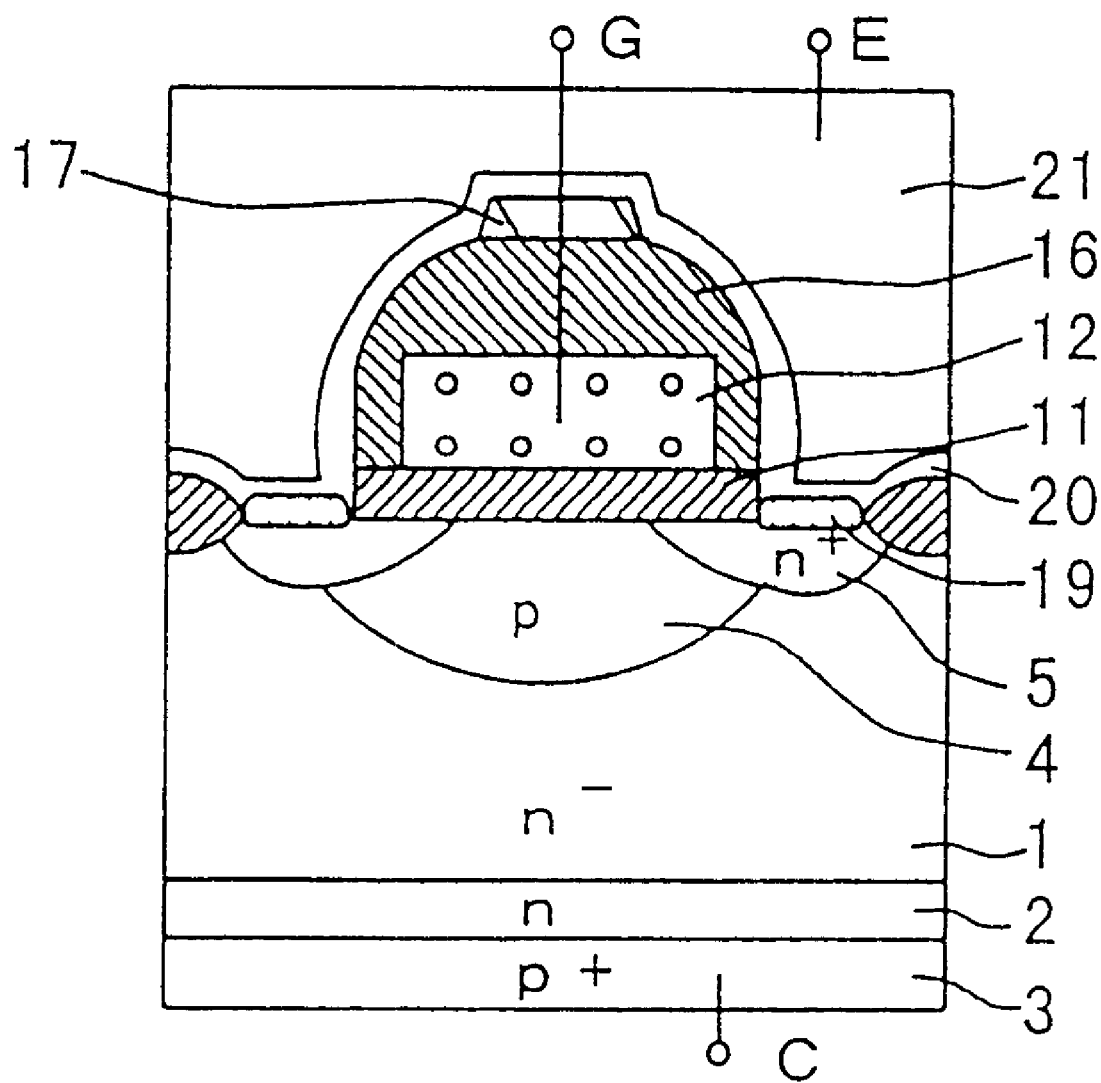
FIG. 17 shows a construction of a conventional planar MOS gate.
Figure 18A:
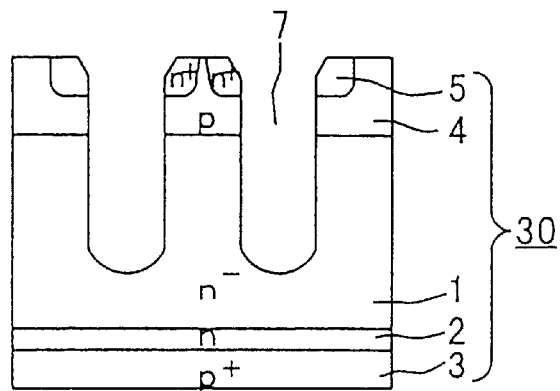
FIGS. 18(a) to 18(d), 19(a) to 19(c) and 20 show the steps of fabricating a conventional power device employing a trench as a MOS gate.
Figure 18B:
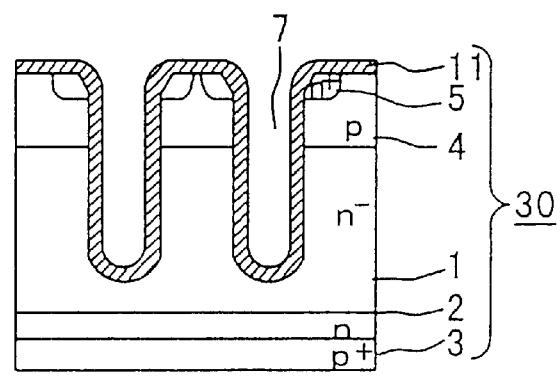
Figure 18C:
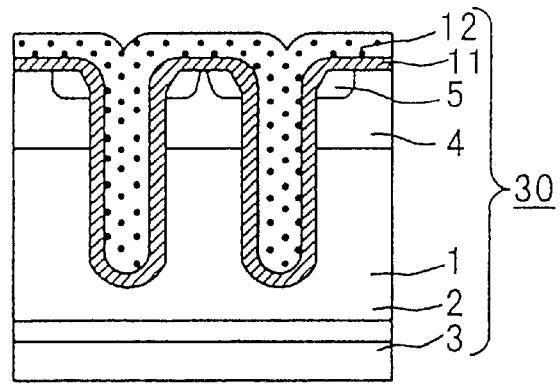
Figure 18D:
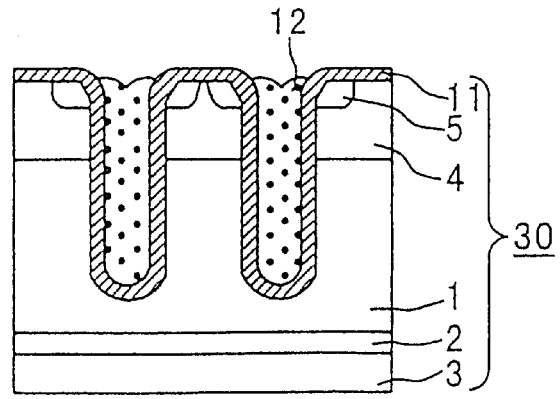
Figure 19A:
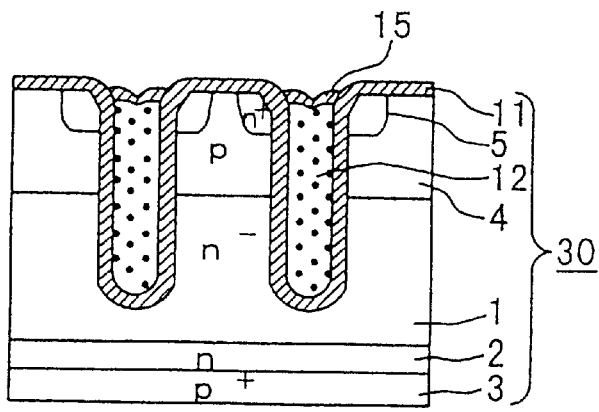
Figure 19B:
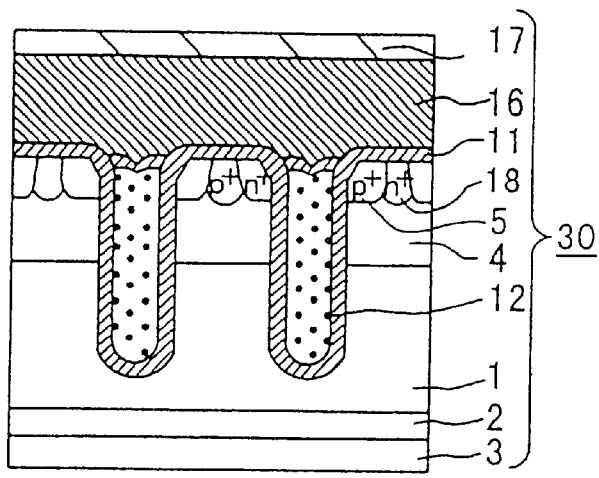
Figure 19C:
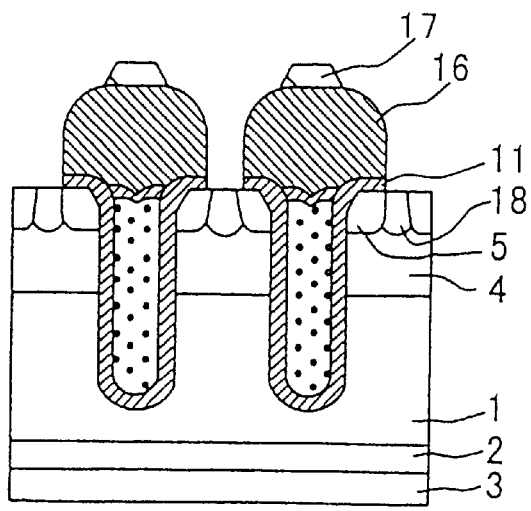

FIGS. 15(a) to 15(c) are exemplary diagrams of a semiconductor device in a seventh embodiment according to the present invention.

FIG. 15(a) is a sectional view of a trenched MOSFET employing the trenched MOS gate construction explained in the second embodiment.

FIG. 15(b) is a sectional view of an IGBT employing the trenched MOS gate construction explained in the second embodiment, in which a collector has a p+/p− construction including p+ type regions 3a as well as a p− type diffused layer 3.

FIG. 15(c) is a fragmentary sectional view of another IGBT employing the trenched MOS gate construction explained in the second embodiment, in which a collector has a p+/n+ construction including n+ type regions 3b as well as a p+ type diffused layer 3. In FIGS. 15(a) to 15(c), parts like or corresponding to those described above are designated by the same reference numerals and the description thereof will be omitted.

As explained above, the trenched MOS gate constructions in the semiconductor devices explained in the first to the sixth embodiment are effectively applicable to various trenched MOS gate power devices and other semiconductor devices.

The effects and advantages of the present invention will be summarize bellow.

As is apparent from the foregoing description, in the trenched semiconductor device and the method of fabricating the trenched semiconductor device according to the present invention, the gate insulating film is formed on the walls of the trenches and extending onto the surface of the semiconductor substrate, and the conductive film is formed so as to fill up and project from the trenches and extends onto the gate insulating film of the surface of the semiconductor substrate. Therefore, the concentration of current flowing through the gate insulating film on the tops of the trenches can be avoided, improving the reliability of the gate insulating film.

In the trenched semiconductor device and the method of fabricating the trenched semiconductor device according to the present invention, the portions of the gate insulating film, formed around the tops of the trenches on the surface of the semiconductor substrate, are formed in a thickness greater than the portions of the same, formed on the walls of the trenches. The portions of the conductive film forming the gates are narrowed or thinned at the tops of the trenches. Therefore, irregularities are not formed in portions of the Si/SiO2 interface at or around the tops of the trenches, which improves the leakage characteristics of the gate insulating film.

In the trenched semiconductor device and the method of fabricating the trenched semiconductor device according to the present invention, the gate insulating film and the conductive film are formed so as to extend continuously across the adjacent trenches. Therefore, the concentration of current flowing through the gate insulating film on the tops of the trenches can be avoided, improving the reliability of the gate insulating film.

In the trenched semiconductor device and the method of fabricating the trenched semiconductor device according to the present invention, the gate insulating film is formed so that the capacitor area of the portion of the gate insulating film lying on the major surface of the semiconductor substrate is 5% or above of the total capacitor area of the gate insulating film. Therefore, the concentration of current flowing through the gate insulating film on the tops of the trenches can be avoided, improving the reliability of the gate insulating film.

In the trenched semiconductor device and the method of fabricating the trenched semiconductor device according to the present invention, the gate insulating film is formed so that the gate edge length of a portion of the gate insulating film, lying outside the trenches on the major surface of the semiconductor substrate, is 30% or above the total gate edge length of the insulating film. Therefore, the concentration of current flowing through the gate insulating film on the tops of the trenches can be avoided, improving the reliability of the gate insulating film.

In the trenched semiconductor device and the method of fabricating the trenched semiconductor device according to the present invention, the gate insulating film is formed so that the thickness of a portion formed on the surface of the semiconductor substrate is twice that of a portion formed on the walls of the trenches or greater. Therefore, the intensity of the electric field applied to portions of the gate insulating film around the tops of the trenches is reduced, the leakage characteristics of the gate insulating film is improved and yield is improved.

In the trenched semiconductor device and the method of fabricating the trenched semiconductor device according to the present invention, the gate insulating film is either a two-layer composite film constructed by depositing a CVD film on a thermal oxide film, a two-layer composite film constructed by forming a thermal oxide film on a CVD film, or a three-layer composite film constructed by depositing a CVD film on a thermal oxide film and forming another thermal oxide film on the CVD film. Therefore, the uniformity in thickness of portions of the gate insulating film, formed on the walls of the trenches, is improved, and the reliability of the gate insulating film is enhanced.

In the trenched semiconductor device and method of fabricating the trenched semiconductor device according to the present invention, nitrogen ions are implanted in the conductive film, filling up the trenches. Therefore, the diffusion of an impurity from the semiconductor substrate into the gate insulating film is suppressed, and the deterioration of the characteristics of the gate insulating film can be avoided. The characteristics of the trenched MOS transistor is, thus improved.

Obviously many modifications and variations of the present invention are possible in the light of the above teachings. It is therefore to be understood that within the scope of the appended claims the invention may by practiced otherwise than as specifically described.

What is claimed is:

1. A trenched semiconductor device including at least a transistor, said trenched semiconductor device comprising:
   a semiconductor substrate, excluding silicon carbide, provided with at least one trench in a major surface thereof, the edge of said trench at said major surface being rounded, a prescribed portion of a sidewall of said trench serving as a channel of said transistor;
   an insulating film formed on the wall of the trench and extending onto the major surface of the semiconductor substrate, said insulating film serving as a gate insulating film of said transistor; and
   a conductive part filling up the trench and extending on to the insulating film, all around the trench, on the major surface of the semiconductor substrate, said conductive part serving as a gate of said transistor, wherein the thickness of the portion of the insulating film is increased at the top portion of the trench so that the thickness of the portion of the conductive part is reduced at the top portion of the trench.

2. The trenched semiconductor device, according to claim 1, wherein the insulating film is continuously formed in the adjacent trenches and on the major surface of the semiconductor substrate therebetween, and the conductive part is continuously formed filling up the adjacent trenches and extending onto the insulating film on the major surface of the semiconductor substrate therebetween.

3. A trenched semiconductor device including at least a transistor, said trenched semiconductor device comprising:
   a semiconductor substrate, excluding silicon carbide, provided with at least one trench in a major surface thereof, the edge of said trench at said major surface being rounded, a prescribed portion of a sidewall of said trench serving as a channel of said transistor;
   an insulating film formed on the wall of the trench and extending onto the major surface of the semiconductor substrate, said insulating film serving as a gate insulating film of said transistor; and
   a conductive part filling up the trench and extending on to the insulating film, all around the trench, on the major surface of the semiconductor substrate, said conductive part serving as a gate of said transistor, wherein a capacitor area of the portion of the insulating film, lying on the major surface of the semiconductor substrate, is 5% or above of a total capacitor area of the insulating film.

4. A trenched semiconductor device including at least a transistor, said trenched semiconductor device comprising:
   a semiconductor substrate, excluding silicon carbide, provided with at least one trench in a major surface thereof, the edge of said trench at said major surface being rounded, a prescribed portion of a sidewall of said trench serving as a channel of said transistor;
   an insulating film formed on the wall of the trench and extending onto the major surface of the semiconductor substrate, said insulating film serving as a gate insulating film of said transistor; and
   a conductive part filling up the trench and extending on to the insulating film, all around the trench, on the major surface of the semiconductor substrate, said conductive part serving as a gate of said transistor, wherein a gate edge length of the portion of the insulating film, lying outside the trench, is 30% or above of a total gate edge length of the insulating film.

5. A trenched semiconductor device including at least a transistor, said trenched semiconductor device comprising:

a semiconductor substrate, excluding silicon carbide, provided with at least one trench in a major surface thereof, the edge of said trench at said major surface being rounded, a prescribed portion of a sidewall of said trench serving as a channel of said transistor;

an insulating film formed on the wall of the trench and extending onto the major surface of the semiconductor substrate, said insulating film serving as a gate insulating film of said transistor; and a conductive part filling up the trench and extending on to the insulating film all around the trench, on the major surface of the semiconductor substrate, said conductive part serving as a gate of said, wherein said insulating film is composed of either a two-layer construction consisting of a thermal oxide film and a CVD film formed on the thermal oxide film, a two-layer construction consisting of a CVD film and a thermal oxide film formed on the CVD film, or a three-layer construction consisting of a thermal oxide film, a CVD film formed on the thermal oxide film, and a thermal oxide film formed on the CVD film.

6. The trenched semiconductor device according to claim 1, wherein said conductive part contains implanted nitrogen.

7. The trenched semiconductor device according to claim 1, wherein the semiconductor substrate is a silicon wafer, the insulating film is a silicon dioxide film, and the conductive part is made of polysilicon.

* * * * *